(12) United States Patent
Katsuno et al.

(10) Patent No.: US 8,017,970 B2
(45) Date of Patent: Sep. 13, 2011

(54) SEMICONDUCTOR LIGHT-EMITTING ELEMENT

(75) Inventors: Hiroshi Katsuno, Tokyo (JP); Yasuo Ohba, Kanagawa-ken (JP); Kei Kaneko, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 12/401,473

(22) Filed: Mar. 10, 2009

(65) Prior Publication Data

US 2009/0230422 A1 Sep. 17, 2009

(30) Foreign Application Priority Data

Mar. 12, 2008 (JP) ................... 2008-062611

(51) Int. Cl.
*H01L 33/00* (2010.01)
(52) U.S. Cl. ............ 257/99; 257/E33.062; 257/E21.002
(58) Field of Classification Search ............ 257/99, 257/E33.062, E21.002, 87, 91, 179
See application file for complete search history.

(56) References Cited

U.S. PATENT DOCUMENTS

| 7,176,479 | B2 | 2/2007 | Ohba | |
|---|---|---|---|---|
| 2003/0006409 | A1 | 1/2003 | Ohba | |
| 2005/0121685 | A1* | 6/2005 | Seong et al. | ............ 257/99 |
| 2007/0034883 | A1 | 2/2007 | Ohba | |

FOREIGN PATENT DOCUMENTS

JP 2007-005591 1/2007

OTHER PUBLICATIONS

M. Batzill et al., "The surface and material science of tin oxide", 2005, Progress in Surface Science, vol. 79, pp. 47-154, Table 1.*
Sze, "Semiconductor Devices. Physics and Technology", 2002, John Willey & Sons, p. 536, Appendix E.*
Katsuno et al.; "Semiconductor Light Emitting Device and Method for Manufacturing Same", U.S. Appl. No. 12/195,580, filed Aug. 21, 2008.
Katsuno et al.; "Semiconductor Light Emitting Device and Semiconductor Light Emitting Apparatus", U.S. Appl. No. 12/195,718, filed Aug. 21, 2008.

* cited by examiner

*Primary Examiner* — Thomas L Dickey
*Assistant Examiner* — Nikolay Yushin
(74) *Attorney, Agent, or Firm* — Finnegan, Henderson, Farabow, Garrett & Dunner, L.L.P.

(57) ABSTRACT

A semiconductor light-emitting element includes, a first semiconductor layer, a second semiconductor layer, a light-emitting layer provided between the first semiconductor layer and the second semiconductor layer, a first electrode connected to the first semiconductor layer, and a second electrode provided on the second semiconductor layer. A side of the second electrode facing to the second semiconductor layer is composed of at least any one of silver and silver alloy. The second electrode has a void having a width of emission wavelength or less of the light-emitting layer in a plane of the second electrode facing to the second semiconductor layer.

20 Claims, 22 Drawing Sheets

SEMICONDUCTOR LIGHT-EMITTING ELEMENT

CROSS-REFERENCE TO RELATED APPLICATIONS

This application is based upon and claims the benefit of priority from the prior Japanese Patent Application No. 2008-062611, filed on Mar. 12, 2008; the entire contents of which are incorporated herein by reference.

BACKGROUND OF THE INVENTION

1. Field of the Invention

This invention relates to a semiconductor light-emitting element and a method for producing the same.

2. Background Art

For improving brightness of a semiconductor light-emitting element, improvement of light taking-out efficiency is important. In a semiconductor light-emitting element, as one example of a structure in which high heat release property and high light taking-out efficiency can be expected, there is a flip-chip type structure in which a light-emitting layer side of a wafer is contacted with a heatsink side and the emitted light is taken out from the substrate side directly or with reflected by the reflection film.

The light emitted in the semiconductor light-emitting element changes its light pathway according to the incident angle to the interface having difference in refractive index. When the incident angle is such a deep incident angle as being near perpendicular to the interface, the light is taken out of the semiconductor element, and when a shallow incident angle, the light is totally internally reflected and returns to the inside of the semiconductor light-emitting element.

In the case of the flip-chip type semiconductor light-emitting element, for improving the light taking-out efficiency, it is thought that the light taking-out surface of the substrate is processed to be a dome shape and that nano-convex-concave structure having diffraction function is formed. However, for example, in the case of a semiconductor light-emitting element in which nitride semiconductor is formed on a sapphire substrate, refractive index difference between the substrate and the semiconductor layer is large, and therefore, in this structure, the light emitted in the semiconductor layer is reflected by its interface and easily trapped in the semiconductor layer. Therefore, even if the light taking-out surface of the substrate is devised, there is a room for upgrading improvement of the light taking-out efficiency.

For improving the light taking-out efficiency, it is also thought that the convex-concave structure is formed by processing the substrate surface on which the semiconductor layer is formed or by forming a non-flat layer in the semiconductor layer or by processing the surface of the semiconductor layer on which a reflective film will be formed. However, every method thereof requires advanced techniques, and additionally, these methods could leads to that the crystal growth condition for forming the convex-concave structure and the crystal growth condition for improving characteristic of the semiconductor light-emitting element are not highly compatible. That is, by forming the convex-concave structure, the crystal quality is degraded, and thereby, degradation of electric characteristic or optic characteristic is feared.

In JP-A 2007-5591 (Kokai), there has been proposed a structure in which the electrode combining with a function of a high efficient reflective film has a region having a width of ½ or less of a wavelength of the radiation light from the light-emitting layer.

SUMMARY OF THE INVENTION

According to an aspect of the invention, there is provided a semiconductor light-emitting element including: a first semiconductor layer; a second semiconductor layer; a light-emitting layer provided between the first semiconductor layer and the second semiconductor layer; a first electrode connected to the first semiconductor layer; and a second electrode provided on the second semiconductor layer; a side of the second electrode facing to the second semiconductor layer being composed of at least any one of silver and silver alloy, and the second electrode having a void having a width of emission wavelength or less of the light-emitting layer in a plane of the second electrode facing to the second semiconductor layer According to another aspect of the invention, there is provided a method for producing a semiconductor light-emitting element including, a first semiconductor layer, a second semiconductor layer, and a light-emitting layer provided between the first semiconductor layer and the second semiconductor layer, a first electrode connected to the first semiconductor layer, and a second electrode provided on the second semiconductor layer, a side of the second electrode facing to the second semiconductor layer being composed of at least any one of silver and silver alloy, including: forming a conductive film to be the second electrode on the second semiconductor layer; attaching at least any one of water and an ionized substance to the conductive film; and forming a void having a width of emission wavelength or less of the light-emitting layer in at least a plane of the conductive film facing to the second semiconductor layer by heat-treating the conductive film being configured to make a gap between grain boundaries in the conductive film.

DETAILED DESCRIPTION OF THE INVENTION

Figure 1A:
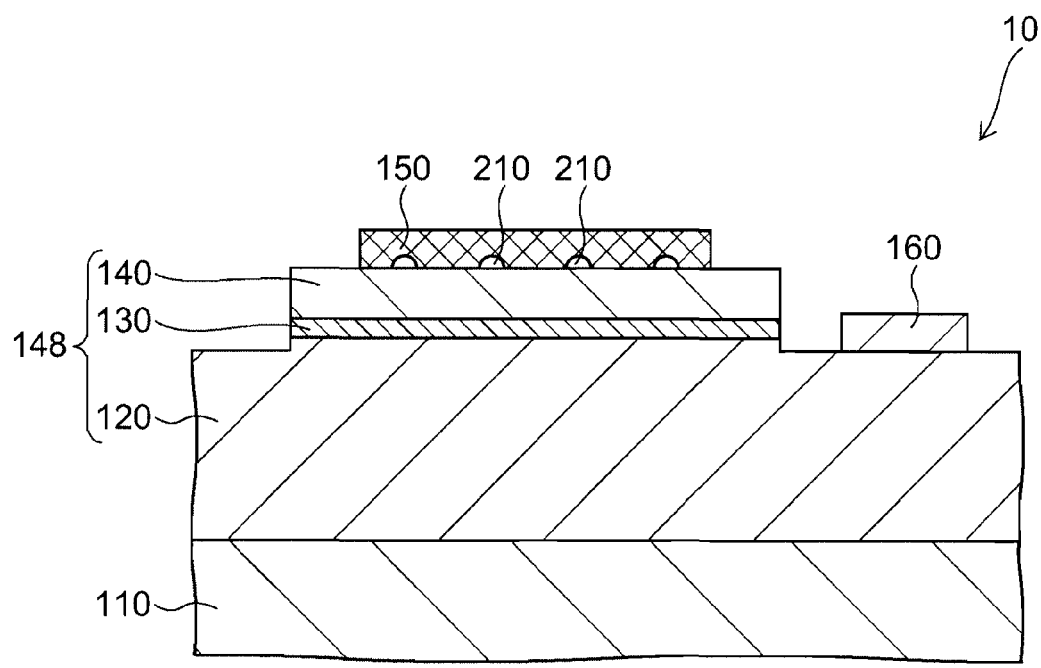
FIGS. 1A and 1B are schematic views illustrating a structure of a semiconductor light-emitting element according to a first embodiment of this invention.

Embodiments of the invention will now be described in detail with reference to the drawings.

It is noted that the figures are schematic or conceptual. The relationship between the thickness and the width of various portions and the ratio in size between the portions are not necessarily the same as those in reality. Furthermore, the same portion may be shown differently in dimension and ratio in different figures.

In the specification and the associated drawings, the same components as those described previously with reference to earlier figures are labeled with like reference numerals, and the detailed description thereof is omitted as appropriate.

First Embodiment

Figure 1B:
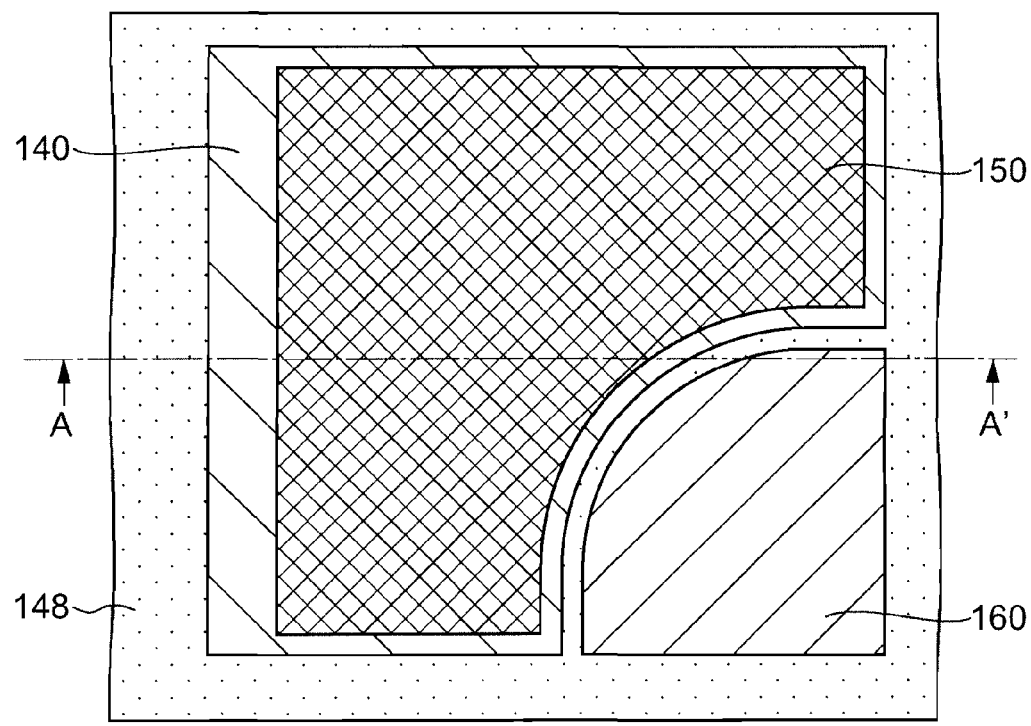

FIGS. 1A and 1B are schematic views illustrating a structure of a semiconductor light-emitting element according to a first embodiment of this invention.

That is, FIG. 1B is a plan schematic view illustrating a structure of the semiconductor light-emitting element according to a first embodiment of this invention, and FIG. 1A is a schematic view of the A-A' line section.

As shown in FIGS. 1A and 1B, the semiconductor light-emitting element 10 according to the first embodiment of this invention has a first semiconductor layer 120, a second semiconductor layer 140, a light-emitting layer 130 provided between the first semiconductor layer 120 and the second semiconductor layer 140, and a first electrode 160 provided on the first semiconductor layer 120, and a second electrode 150 provided on the second semiconductor layer 140.

That is, the semiconductor light-emitting element 10 according to this embodiment has a semiconductor layer 148 including the first semiconductor layer 120, the second semiconductor layer 140, and the light-emitting layer 130 sandwiched thereby. For this semiconductor layer 148, a nitride semiconductor such as $Al_xGa_{1-x-y}In_yN$ ($x \geq 0$, $y \geq 0$, $x+y \leq 1$) can be used. However, this invention is not limited thereto.

And, for the first semiconductor layer 120, semiconductor having n-type conductivity can be used, and for the second semiconductor layer 140, semiconductor having p-type conductivity can be used.

Moreover, as shown in FIGS. 1A and 1B, the semiconductor layers (the first semiconductor layer 120, the light-emitting layer 130, and the second semiconductor layer 140) can be formed on a substrate 110. In this case, the method for forming the semiconductor layer 148 is not particularly limited, and a technique such as a metal organic chemical vapor deposition method and a molecular-beam epitaxial growth method can be used.

For this substrate 110, for example, sapphire, SiC, GaN, GaAs, Si, or the like can be used. In the case of using such a material of transmitting light emitted from the light-emitting layer 130 as sapphire, light can be taken out through the substrate 110. On the other hand, when the substrate 110 is formed by a material that does not transmit light emitted from the light-emitting layer 130, the light can also be taken out to the outside with reflected by the interface between the semiconductor layer 148 and the substrate 110. The substrate 110 may be removed on the way of the production of the semiconductor light-emitting element or after the production thereof. In this case, the light emitted from the light-emitting layer 130 can be taken out from the lower surface of the semiconductor layer 148 (the surface of the lower side in FIG. 1A).

And, for the second electrode 150, for example, at least any one of silver and silver alloy can be used. However, this invention is not limited thereto, and in the second electrode 150, at least the side facing to the second semiconductor layer 140 may be made of at least any one of silver and silver alloy.

A material of a conductive film to be the second electrode 150 may be a silver monolayer film or a silver alloy layer consisting of silver and metal except for silver. The reflection efficiencies of many metal monolayer films except for silver tend to decrease as the wavelength is shorter in the ultraviolet spectrum, but silver also has high reflection efficiency characteristic with respect to light of the ultraviolet spectrum of 370 nm to 400 nm. Therefore, by using silver or silver alloy as the second electrode 150, the light generated in the light-emitting layer 130, particularly light of ultraviolet spectrum is reflected high-efficiently, and the semiconductor light-emitting element 10 of high brightness can be realized.

And, in the semiconductor light-emitting element of ultraviolet emission, when the conductive film to be the second electrode 150 is formed by silver alloy, it is preferable that the second semiconductor layer 140 side of the conductive film has a higher component ratio of silver than that of the other parts. It is preferable that the thickness of the conductive film to be the second electrode 150 is thicker than an inverse number of an absorption coefficient of silver for ensuring the reflection efficiency to light, and 100 nm or more is further preferable.

Furthermore, the second electrode 150 has a void 210 having a width of emission wavelength or less of the light-emitting layer 130 in a plane of the second electrode facing to the second semiconductor layer.

As described later, by the void 210, the light pathway of the light emitted in the light-emitting layer 130 can be changed, the light trapping effect is suppressed by total internal reflection, and the semiconductor light-emitting element having high light taking-out efficiency can be provided.

Moreover, it is sufficient that the void 210 is provided at least in the interface side of the electrode 150 to the second semiconductor layer 140, and the void 210 may also be provided in the interface of the second electrode 150 opposite to the second semiconductor layer 140 at the same time of being provided in the interface side of the electrode 150 to the second semiconductor layer 140. Moreover, the void 210 may also be provided in the layer of the second electrode 150 at the same time of being provided in the interface side of the electrode 150 to the second semiconductor layer 140, and furthermore, the void 210 may be provided so as to pass through the thickness direction of the second electrode 150. That is, it is sufficient that the void 210 is provided at least in the interface side of the electrode 150 to the second semiconductor layer 140, to which the light from the semiconductor layer 148 is incident.

The void 210 of the second electrode 150 can be formed by self-assembly according to migration of silver by high-temperature heat treatment.

For the material of the first electrode 160, various monolayer films or multilayer films with conductivity that can be used as the ohmic electrode of the first semiconductor layer 120 can be used as the material of the first electrode 160. The method for forming the first electrode 160 is not particularly limited, but for example, it is possible that the multilayer structure is formed by an electron-beam deposition method and then sintering treatment is performed. In the case of performing the sintering treatment, it is preferable that a pad is provided separately in the first electrode 160 for improving bondability.

In order to improve bondability of wire bonding, to improve die shear strength in formation of gold bump with a ball bonder, to perform application to flip-chip mount, and so forth, a pad may be separately provided in the second electrode 150. The film thickness of the pad can be selected, for example, in 100 nm to 10000 nm.

Figure 2:
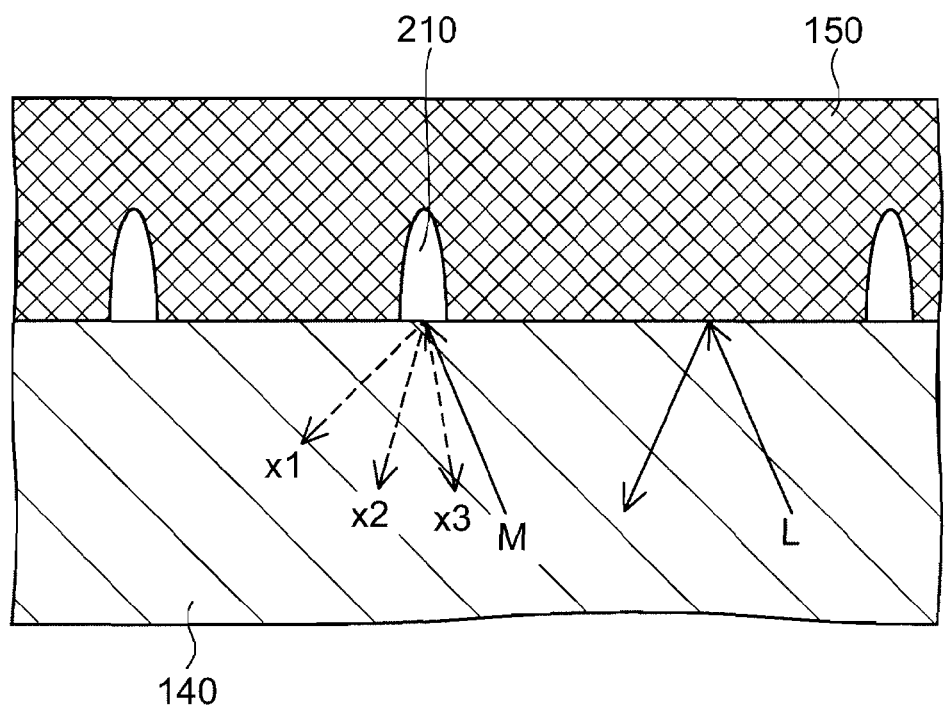
FIG. 2 is an enlarged schematic view illustrating a structure of a substantial part of the semiconductor light-emitting element according to the first embodiment of this invention.

FIG. 2 is an enlarged schematic view illustrating a structure of a substantial part of the semiconductor light-emitting element according to the first embodiment of this invention.

As shown in FIG. 2, in the semiconductor light-emitting element 10 according to the first embodiment of this invention, the light incident to the part except for the void 210 of the light emitted from the light-emitting layer 130 to the second electrode 150 is mirror-reflected according to geometric optics similarly to the light L. On the other hand, because the width of the void 210 is smaller than the emission wavelength, the light incident to the void 210 shows behavior explained by wave optics such as scattering or diffraction. As a result, for example, lights X1, X2, and X3 scatter-reflected are generated.

As described above, in the semiconductor light-emitting element 10 according to this embodiment, by providing the void 210 having a width of wavelength or less in the second electrode 150, the region of scatter characteristic (diffuse reflection characteristic) can be formed in the interface between the second electrode 150 and the second semiconductor layer 140. Thereby, lights having various angles (such as light X1, X2, and X3) are generated, the incident angle of a part of the light that has a shallow incident angle with respect to the interface with refractive index difference (such as the interface between the semiconductor layer 148 and the substrate) and that is trapped inside the semiconductor light-emitting element 10 can be changed, and the light can be effectively taken out to the outside.

Thereby, by the semiconductor light-emitting element 10 according to this embodiment, a semiconductor light-emitting element with high light taking-out efficiency can be provided.

In general, as the width of the void 210 becomes smaller than the emission wavelength, wave property of the light is enhanced and the scatter-reflected component of the light increases. As a result thereof, the light taking-out efficiency of the semiconductor light-emitting element 10 is improved.

Here, "mirror reflection" is reflection that the incident angle and the reflection angle of the light are equal as explained by geometric optics, "diffuse reflection" is reflection that the light is scattered to all of the directions as explained by wave optics.

In the case of the semiconductor light-emitting element in which a sapphire substrate is used, the reflective index difference between the substrate 110 and the semiconductor layer 148 is large, and therefore, a large part of the emitted light are reflected on the interface and a large part of the emitted light is easily trapped inside the semiconductor layer 148. By contrast, according to the semiconductor light-emitting element 10 according to this embodiment, by diffuse-reflecting the emitted light, the light can be effectively taken out to the outside, and therefore, the light taking-out efficiency is improved. As described above, it is effective to apply the semiconductor light-emitting element 10 according to this embodiment to the semiconductor light-emitting element in which a sapphire substrate is used.

Figure 3A:
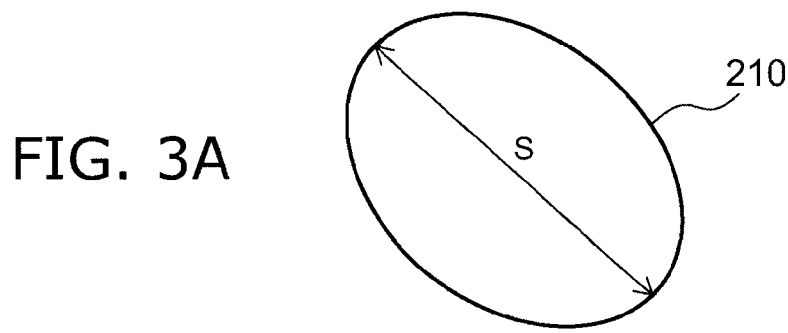
FIGS. 3A and 3B are schematic views illustrating voids of the semiconductor light-emitting element according to the first embodiment of this invention.
Figure 3B:
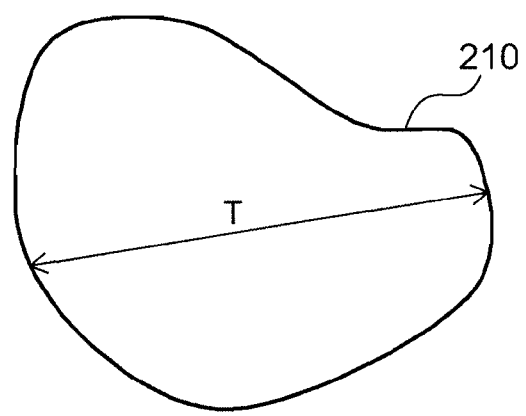

FIGS. 3A and 3B are schematic views illustrating voids of the semiconductor light-emitting element according to the first embodiment of this invention.

That is, the FIGS. 3A and 3B illustrate size (width) of voids when the voids have an elliptical shape and a shape except for elliptical shape, respectively.

As shown in FIGS. 3A and 3B, in the semiconductor light-emitting element 10 according to the first embodiment, the width of the void 210 represents the long diameter S in the case that the sectional shape of the void 210 in the interface of the void 210 to the second semiconductor layer 140 is an elliptical shape (FIG. 3A), and the width of the void 210 represents the longest direct distance T in the void 210 in the other cases (FIG. 3B).

And, the width of the void 210 becomes the above-described long diameter S or the direct distance T in the plane shape of the void 210 in the section of the plane of the second electrode 150 facing to the second semiconductor layer 140.

It is preferable that the width of the void 210 is the emission wavelength or less. The emission spectrum of the semiconductor light-emitting element 10 has a half bandwidth of about several tens of nanometers. However, the emission wavelength represents the peak emission wavelength when the optical output becomes the maximum in the default operating current.

When an action body such as the void 210 is sufficiently larger in comparison to the wavelength of the light, the light is treated as a light flux going straight and the behavior of the light is explained by geometric optics such as Snell's law. On the other hand, when the action body has approximately the same size as the wavelength of the light, the light increases its wave property, and phenomenon that cannot be explained by geometric optics is generated. Bending of the light is caused by the wave property such as diffraction or scattering. The wave property significantly appears in the region in which the size of the action body is the wavelength or less. In this region, the behavior of the light cannot be strictly calculated based on electromagnetics.

In a general semiconductor light-emitting element, there are methods in which for improving the light taking-out efficiency, non-flat surfaces (convex-concave structure) are formed by processing, a substrate surface, inside of a semiconductor layer, and a surface of the semiconductor layer in contact with a reflection film. However, the surfaces formed by these methods have convex-concave structures with larger characters than the wavelength of the light and have mirror-reflection characteristics according to the geometric optics as viewed microscopically. By contrast, in the semiconductor light-emitting element 10 according to this embodiment, the size of the void 210 is wavelength of the light or less, and has a characteristic of the wave property which cannot be explained by geometrical optics as described above. Thereby, the semiconductor light-emitting element with high light taking-out efficiency that cannot be obtained by the other methods can be provided.

As the density or the area ratio of the void 210 in the interface of the second electrode 150 to the second semiconductor layer 140 is higher, the light taking-out efficiency is higher. However, when the density and the area ratio of the void 210 becomes too high, the contact area between the second electrode 150 and the second semiconductor layer 140 becomes small and the operation voltage occasionally becomes high.

In this case, in such a case of lateral direction current application as the second electrode 150 and the first electrode 160 are on approximately the same plane like the semiconductor light-emitting element 10 illustrated in FIGS. 1A and 1B, current tends to concentrate in the region in which the distance between the second electrode 150 and the first electrode 160 become the minimum, and therefore, decreasing the contact area between the second electrode 150 and the second semiconductor layer 140 due to the void 210 does not act on the operation voltage to the extent of the lowering amount.

Considering the combination with operation voltage, it is preferable that the area ratio of the void 210 with respect to the entire area of the second electrode 150 is 10% or less, and 5% or less is further preferable. Moreover, in the case of providing a plurality of voids 210 in the second electrodes 150, it is desirable that the widths of the majority of these voids 210 are set to be wavelength or less of the emitted light. Thereby, more than half of the voids 210 generate diffraction or scattering based on the wave property of the light as described above, and the light taking-out efficiency can be improved. Moreover, when a plurality of voids 210 are provided in the second electrode 150, it is also possible that the average of the widths of these voids 210 is set to be wavelength of the emitted light or less. Thereby, also, a large number of the voids generate diffraction or scattering based on the wave property of the light, and the light taking-out efficiency can be improved.

FIRST EXAMPLE

Hereinafter, a first example according to this embodiment will be explained.

Figure 4:
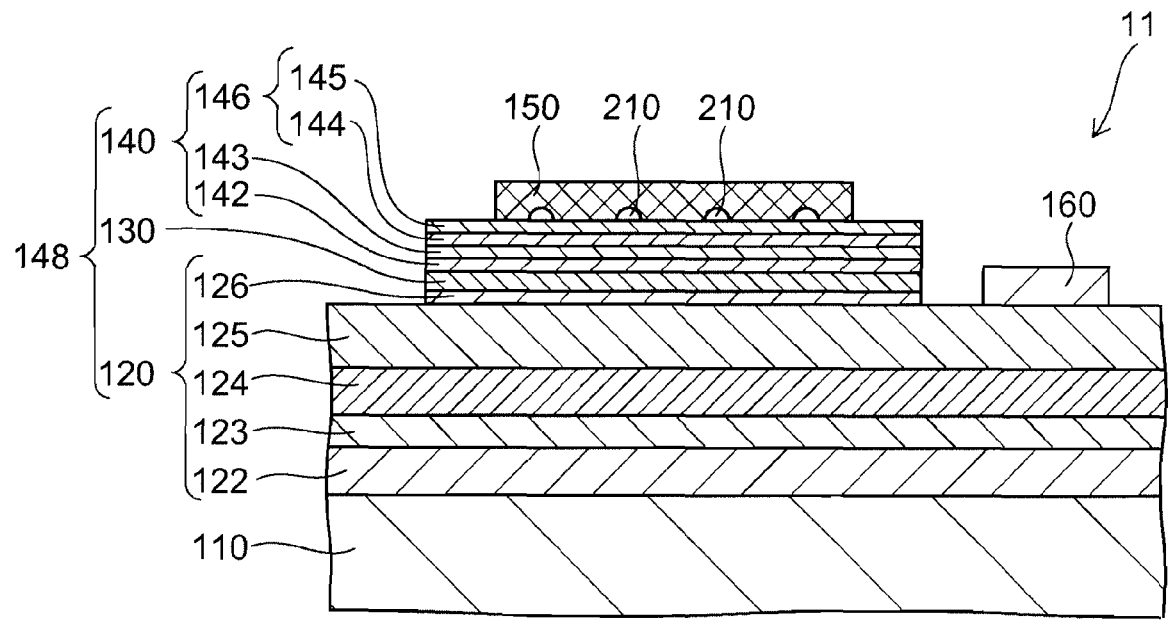
FIG. 4 is a sectional schematic view illustrating a structure of the semiconductor light-emitting element according to the first example.

FIG. 4 is a sectional schematic view illustrating a structure of the semiconductor light-emitting element according to the first example of this invention.

As shown in FIG. 4, a semiconductor light-emitting element 11 according to the first example of this invention has the same structure as the semiconductor light-emitting element 10 according to the first embodiment illustrated in FIGS. 1A and 1B.

The planar structure thereof can be the same as the semiconductor light-emitting element 10 according to this embodiment illustrated in FIGS. 1A and 1B, and therefore, the explanation thereof will be omitted.

The semiconductor light-emitting element 11 according to this example has the semiconductor layer 148 in which on the substrate 110, a first AlN buffer layer 122 with a film thickness of 3 nm to 20 nm and a high carbon concentration (the carbon concentration is $3\times10^{18}$ cm$^{-3}$ to $5\times10^{20}$ cm$^{-3}$), a second AlN buffer layer 123 of high purity with a film thickness of 2 μm (the carbon concentration is $1\times10^{16}$ cm$^{-3}$ to $3\times10^{18}$ cm$^{-3}$), a non-doped GaN buffer layer 124 with a film thickness of 3 μm, a Si-doped n-type GaN contact layer 125 with a film thickness of 4 μm (the Si concentration is $1\times10^{16}$ cm$^{-3}$ to $1\times10^{19}$ cm$^{-3}$), a Si-doped n-type AlGaN clad layer 126 with a film thickness of 0.02 μm (the Si concentration is $1\times10^{16}$ cm$^{-3}$), the light-emitting layer 130 with a film thickness of 0.075 μm having a multiquantum well structure in which Si-doped n-type AlGaN barrier layers (the Si concentration is $1\times10^{19}$ cm$^{-3}$) and GaInN light-emitting layers (peak emission wavelength in applying current is 380 nm) are stacked alternately in three periods, a non-doped AlGaN spacer layer 142 with a film thickness of 0.02 μm, a Mg-doped p-type AlGaN clad layer 143 with a film thickness of 0.02 μm (the Mg concentration is $1\times10^{19}$ cm$^{-3}$), a Mg-doped p-type GaN contact layer 144 with a film thickness of 0.1 μm (the Mg concentration is $1\times10^{19}$ cm$^{-3}$), and a high-concentration-Mg-doped p-type GaN contact layer 145 with a film thickness of 0.02 μm (the Mg concentration is $2\times10^{20}$ cm$^{-3}$) are stacked.

And, the semiconductor light-emitting element 11 has the second electrode (p-side electrode) 150 provided with a void having a width of wavelength of the light or less.

Thereby, the semiconductor light-emitting element with high light taking-out efficiency can be provided.

As described above, the first AlN buffer layer 122, the second AlN buffer 123, the non-doped GaN buffer layer 124, the Si-doped n-type GaN contact layer 125, and the Si-doped n-type AlGaN clad layer 126 become the first semiconductor layer 120.

And, the non-doped AlGaN spacer layer 142, the Mg-doped p-type AlGaN clad layer 143, the Mg-doped p-type GaN contact layer 144, and the high-concentration-Mg-doped p-type GaN contact layer 145 become the second semiconductor layer 140.

The Mg-doped p-type GaN contact layer 144 and the high-concentration-Mg-doped p-type GaN contact layer 145 become a p-type GaN contact layer 146.

The first AlN buffer layer 122 with a high carbon concentration functions to relax the mismatch of the lattice to the substrate 110, and particularly, reduces screw dislocation.

The second AlN buffer layer 123 of high purity is a layer for planarizing the surface at the atomic level and reducing defects of the non-doped GaN buffer layer to be grown thereon, and it is preferable that the thickness thereof is thicker than 1 µm. Moreover, for preventing warpage due to strain, it is desirable that the thickness is 4 µm or less. The second AlN buffer layer of high purity is not limited to AlN, but $Al_xGa_{1-x}N$ ($0.8 \leqq x \leqq 1$) is possible, the warpage of the wafer can be compensated.

The non-doped GaN buffer layer 124 functions as defect reduction by 3-dimentional island growth on the second AlN buffer layer 123. For the planarization of the growth surface, it is necessary that the average film thickness of the non-doped GaN buffer layer 124 is 2 µm or more. Moreover, from the viewpoints of reproducibility and lowering of warpage, it is appropriate that the total film thickness of the non-doped GaN buffer layer 124 is 4 to 10 µm.

By adopting these buffer layers, in comparison to a conventional low-temperature growth AlN buffer layer, it can be realized that the defects are reduced to about 1/10. By this technique, despite high-concentration Si-doping to the n-type GaN contact layer (Si doped n-type GaN contact layer) 125 and emission of ultraviolet spectrum, the semiconductor light-emitting element with high efficiency can be produced.

That is, in the case of a general nitride semiconductor layer formed on a sapphire substrate, a large number of defects existing in the semiconductor layer 148 and the low-temperature growth buffer layer becoming amorphous or polycrystalline and so forth are light absorbers, and the light is absorbed in being reflected, and therefore, loss of the light is caused.

At this time, by using the single crystal AlN buffer layer (the first AlN buffer layer 122, the second AlN buffer layer 123 of high purity, and the non-doped GaN buffer layer 124) like the semiconductor light-emitting element 11 according to this example, not only absorption in the buffer layer becomes difficult to be caused but also the defects in the semiconductor layer 148 is reduced, and therefore, factors causing light absorption in the semiconductor layer 148 can be reduced as much as possible, and the loss can be lowered. Therefore, by using the single crystal AlN buffer layer, even if density and area ratio of the voids 210 is lowered, high light taking-out efficiency can be obtained.

As described above, in the semiconductor light-emitting element of this example, the second electrode (p-side electrode) 150 provided with the void 210 having a width of wavelength of the light or less is used, and also, the single crystal AlN buffer layer is used, and therefore, absorption is difficult to be caused in the buffer layer, and the defects in the semiconductor layer decreases, and the factors causing light absorption in the semiconductor layer can be reduced as much as possible, and the semiconductor light-emitting element with high light taking-out efficiency can be provided.

In the semiconductor light-emitting element 11 of this example, if Mg concentration of the high-concentration-Mg-doped p-type GaN contact layer 145 is set to be at a level of $10^{20}$ cm$^{-3}$, which is relatively high, ohmic property between the p-type GaN contact layer 146 and the second electrode 150 is improved. However, in the case of a semiconductor light-emitting diode, differently from semiconductor laser diode, the distance between the high-concentration-Mg-doped p-type GaN contact layer 145 and the light-emitting layer 130 is small, and therefore, if the Mg concentration of the high-concentration-Mg-doped p-type GaN contact layer 145 is set to be high as described above, degradation of characteristics due to Mg diffusion is feared. However, in the case of the semiconductor light-emitting diode, current density in the operation is low, and therefore, by suppressing the Mg concentration to be $10^{19}$ cm$^{-3}$, the diffusion of Mg can be prevented without largely degrading the electric characteristics, and the light-emitting characteristics can be improved.

Moreover, by using the single crystal AlN buffer layer, differently from the low-temperature growth AlN buffer layer that is amorphous or polycrystalline, the buffer layer is difficult to become an absorbing body to the emitted light, and the defects in the semiconductor layer 148 can be reduced, and the factors causing light absorption in the semiconductor layer 148 can be reduced as much as possible. Thereby, the emitted light can repeat reflection at many times in the interface of the substrate 110 and the epitaxial layer and in the interface of the epitaxial layer and the p-side electrode 150, and therefore, the emitted light is trapped in the epitaxial layer and becomes easy to be affected by the void 210, and thereby, even if the density and the area ratio of the void 210 is low, high effect can be obtained.

Second Embodiment

Next, a method for producing a semiconductor light-emitting element according to a second embodiment of this invention will be explained.

Figure 5:
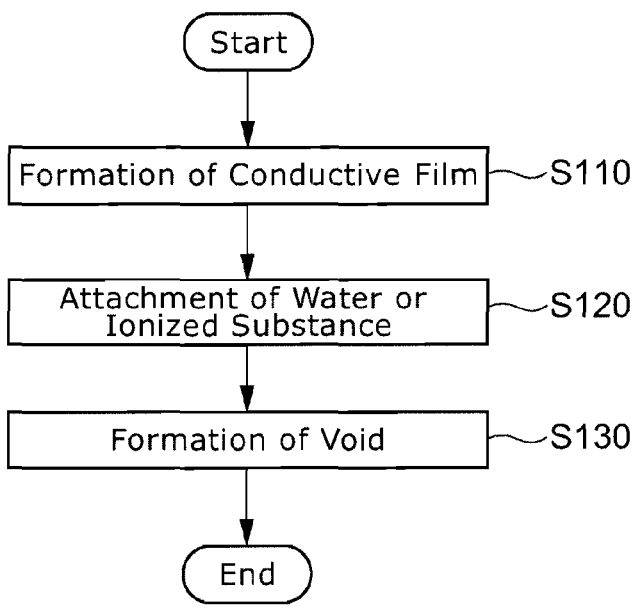
FIG. 5 is a flow chart illustrating a method for producing a semiconductor light-emitting element according to a second embodiment of this invention.

FIG. 5 is a flow chart illustrating a method for producing a semiconductor light-emitting element according to a second embodiment of this invention.

As shown in FIG. 5, in the method for producing a semiconductor light-emitting element according to the second embodiment of this invention, first on the semiconductor layer 148, a conductive film to be the second electrode (p-side electrode) 150 is formed (Step S110). This conductive film can include at least any one layer of silver and silver alloy.

And, to this conductive film, at least any one of water and ionized substance is attached (Step S120).

And, the void 210 having a width of emission wavelength or less of the emitting light of the semiconductor light-emitting element in at least a plane of the conductive film facing to the second semiconductor layer 140 by heat-treating the conductive film at a high temperature to make a gap in grain boundaries in the conductive film (Step S130).

As described above, according to the method for producing the semiconductor light-emitting element of this embodiment, by making the conductive film to be the second electrode 150 migrate, a gap is made in grain boundaries in the conductive film, the void 210 having a width of wavelength or less of the emitted light can be easily formed in the conductive film like self-assembly, and the producing method by which the semiconductor light-emitting element with high light taking-out efficiency can be easily produced.

As described later, before forming the above-described conductive film to be the second electrode 150, a drying step for removing moisture attached to the surface of the semiconductor layer 148 and so forth can be provided. Moreover, as described later, by controlling temperature condition of the above-described high-temperature heat treatment and the temperature-lowering rate after the high-temperature heat treatment, generation of the void 210 can be controlled.

SECOND EXAMPLE

Hereinafter, the method for producing a semiconductor light-emitting element that is a second example according to this embodiment will be explained. That is, the second example is an example of the above-described method for producing the semiconductor light-emitting element 11 according to the first example.

Figure 6A:
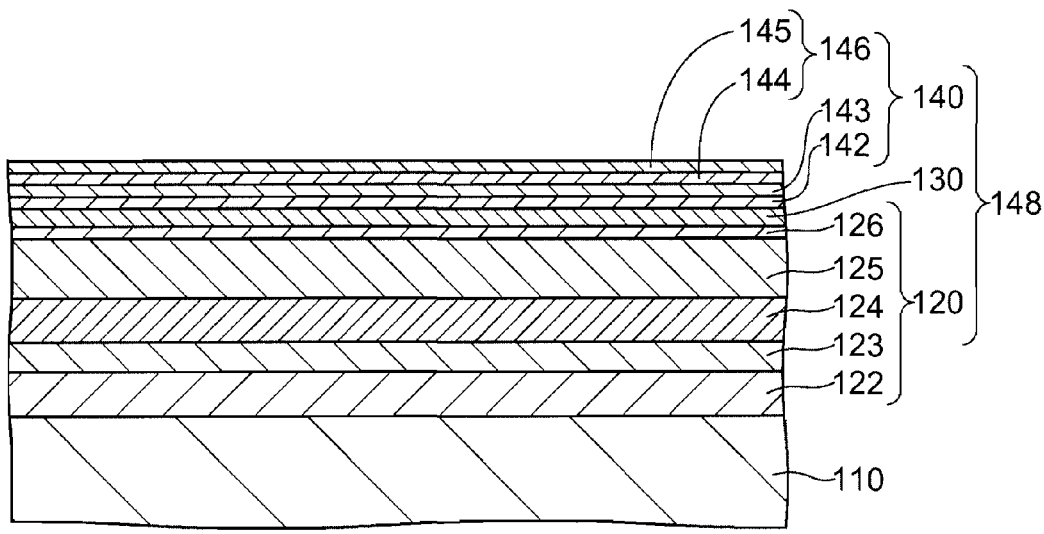
FIGS. 6A to 6C are schematic sectional views following step sequence illustrating a part of the method for producing a semiconductor light-emitting element according to the second example.
Figure 6B:
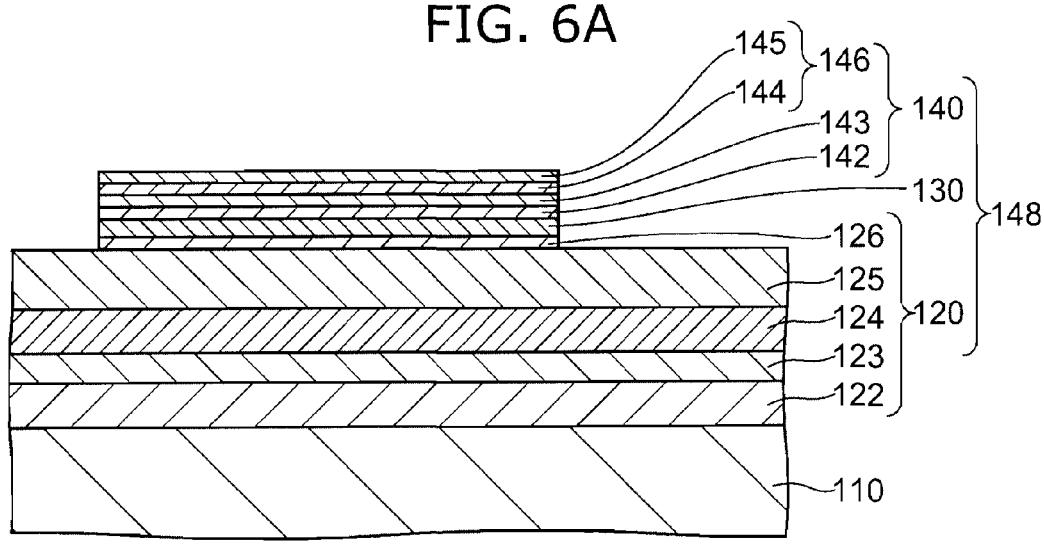
Figure 6C:
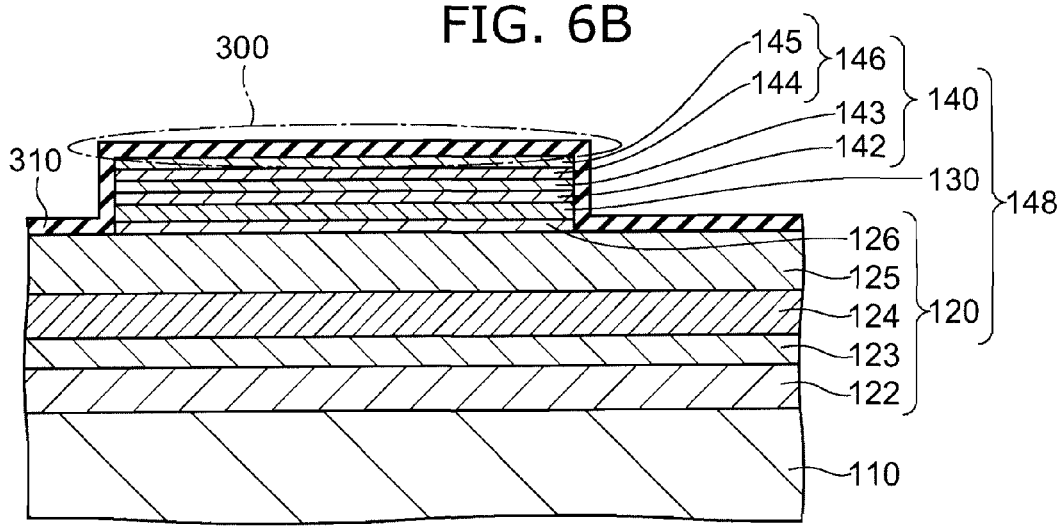

FIGS. 6A to 6C are schematic sectional views following step sequence illustrating a part of the method for producing a semiconductor light-emitting element according to the second example of this invention.

FIG. 6A is a view of a first step, and FIGS. 6B and 6C are views following the preceding views, respectively.

As shown in FIG. 6A, in the method for producing the semiconductor light-emitting element 11 according to the second example of this invention, first by using a metal organic chemical vapor deposition, on the substrate 110 whose surface is composed of sapphire c surface, the first AlN buffer layer 122 with high carbon concentration, the second AlN buffer layer 123 of high purity, the non-doped GaN buffer layer 124, the Si-doped n-type GaN contact layer 125, the Si-doped n-type AlGaN clad layer 126, the light-emitting layer 130 having a multiquantum well structure in which Si-doped n-type AlGaN barrier layers and GaInN light-emitting layers are stacked alternately in three periods, the non-doped AlGaN spacer layer 142, the Mg-doped p-type AlGaN clad layer 143, the Mg-doped p-type GaN contact layer 144, and the high-concentration-Mg-doped p-type GaN contact layer 145 were stacked in this order. Film thicknesses and concentrations of carbon, Si, and Mg are the same as described in the first example.

And, as shown in FIG. 6B, in some region of the semiconductor layer 148, the p-type semiconductor layer (second semiconductor layer) 140 and the light-emitting layer 130 and the Si doped n-type AlGaN clad layer 126 were removed by dry etching by using a mask until the n-type contact layer 125 is exposed to the surface thereof.

And, as shown in FIG. 6C, on the entire the semiconductor layer 148 containing a part of the exposed n-type semiconductor layer (first semiconductor layer) 140, SiO$_2$ film 310 is stacked at a film thickness of 400 nm by using a thermal CVD (Chemical Vapor Deposition) apparatus.

And, the p-side electrode 150 is formed thereon. Hereinafter, the method for forming this p-side electrode 150 will be explained in detail. That is, hereinafter, only the region 300 shown in FIG. 6C in which the p-side electrode 150 is formed will be explained.

FIGS. 7A to 7D are schematic sectional views following the step sequence of the substantial part illustrating the method for producing a semiconductor light-emitting element according to the second example of this invention.

Figure 7A:
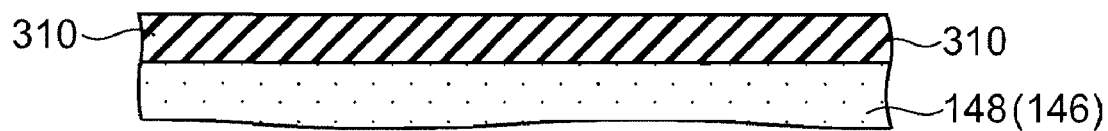
FIGS. 7A to 7D are schematic sectional views following the step sequence of the substantial part illustrating the method for producing a semiconductor light-emitting element according to the second example.
Figure 7B:
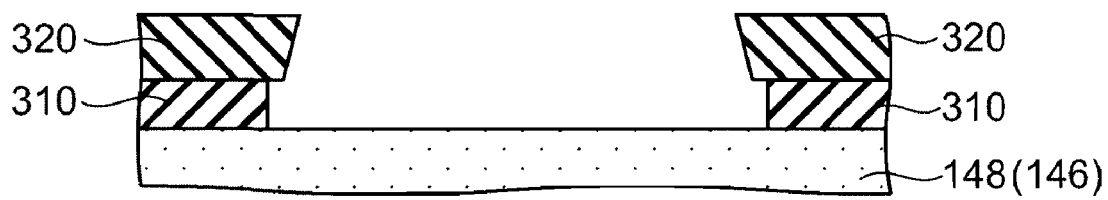
Figure 7C:
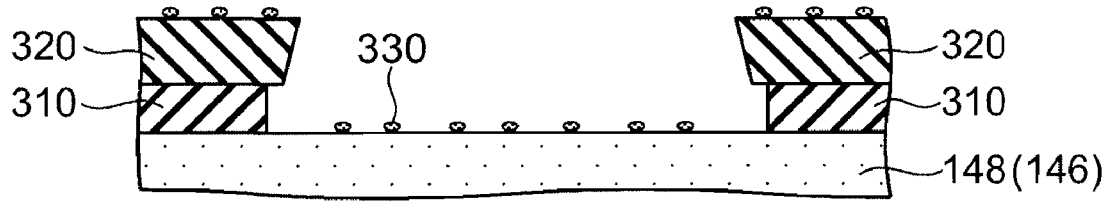

FIG. 7A is a view of a first step, and FIGS. 7B, 7C, and 7C are views following the preceding views, respectively.

And, FIGS. 8A to 8D are schematic sectional views following the step sequence following FIGS. 7A to 7D.

FIG. 7A is an enlarged schematic sectional view of the region 300 illustrated in FIG. 6C in which the SiO$_2$ film 310 is formed on the semiconductor layer.

First, as shown in FIG. 7B, on the semiconductor layer 148, a lift-off resist 320 is formed in a predetermined pattern, and some of the SiO$_2$ film 310 on the p-type GaN contact layer 146 was removed by ammonium fluoride treatment, and moisture on the wafer (the substrate 110, the semiconductor layer 148, and the SiO$_2$ film 310 in this case) was blown off by an air blow or a spin dryer or the like.

In this case, as shown in FIG. 7C, in the state that the moisture on the wafer is merely blown off, a little moisture remains on the wafer surface in the state of being not controlled.

Figure 7D:
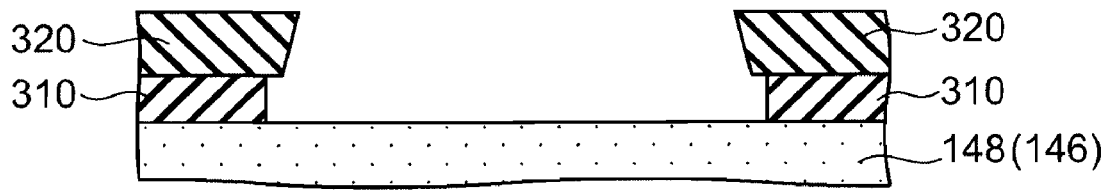

Therefore, then, as shown in FIG. 7D, the moisture on the wafer is sufficiently dried and removed.

Figure 8A:
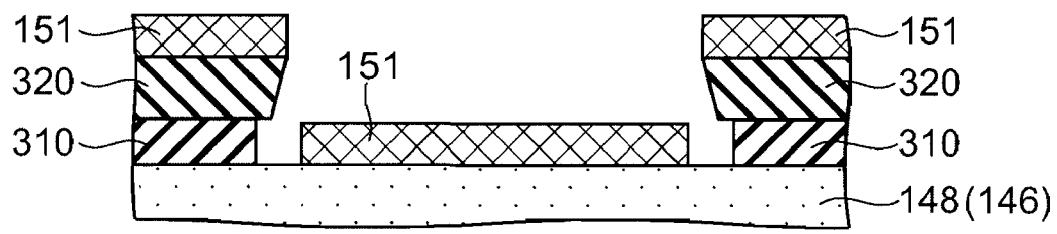
FIGS. 8A to 8D are schematic sectional views following the step sequence following FIGS. 7A to 7D.

And, as shown in FIG. 8A, by a vacuum deposition apparatus, on the entire wafer, silver (Ag), platinum (Pt), and titanium (Ti) were film-formed in this order at a total film-thickness of 200 nm, and thereby, a conductive film 151 for forming the p-side electrode 150 was formed. This invention is not limited thereto, and for this conductive film 151, at least any one layer of silver and silver alloy can be used.

Figure 8B:
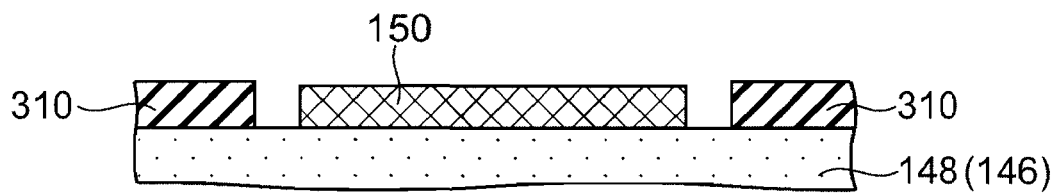

And, as shown in FIG. 8B, the resist 320 was dissolved by an organic solvent, and thereby, only the conductive film 151 formed on the resist 320 was removed and sufficiently rinsed by ultrapure water, and then, the wafer was sufficiently dried on a hot plate at 120° C. Thereby, the p-side electrode 150 was formed in the region in which the SiO$_2$ film 310 was removed.

Figure 8C:
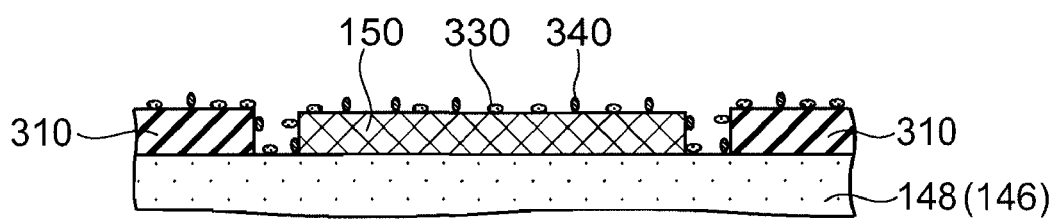

And, as shown in FIG. 8C, the wafer was kept in a clean room in which the temperature and the humidity were controlled to be 25° C.±1° C. and 50%±1% respectively for 24 hours, and thereby, a little water (moisture) 330 and/or ionized substance 340 was attached to the surface of the formed p-side electrode 150.

Figure 8D:
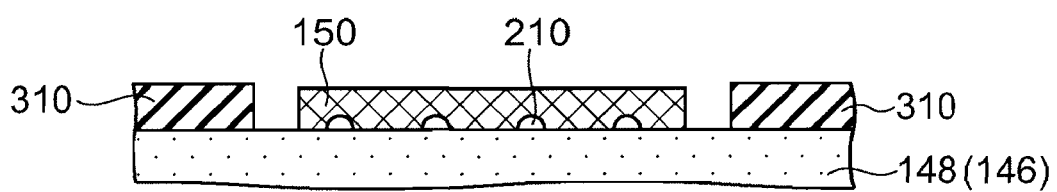

And, as shown in FIG. 8D, by using an RTA (Rapid Thermal Annealing) apparatus, temperature of the wafer was raised to 800° C. at 5° C./second in a nitrogen atmosphere, and the wafer was subjected to heat treatment for 1 minute in the nitrogen atmosphere at 800° C., and the temperature was lowered to the normal temperature at 0.5° C./second, and thereby, the void 210 was formed in the interface between the p-type GaN contact layer 146 and the p-side electrode 150. That is, migration was generated in the conductive film 151, and a gap was made between the gain boundaries of the conductive film 151, and thereby, the void 210 could be formed.

Then, for forming the first electrode (n-side electrode) 160, a patterned lift-off resist (not shown) was formed, the SiO$_2$ film 310 on the n-type contact layer 125 exposed from the resist was removed by ammonium fluoride treatment.

And, by a vacuum deposition apparatus, a thin film composed of Ti/Pt/Au was formed on the entire wafer at the film thickness of 500 nm, and by lift-off method, in the region in which the SiO$_2$ film 310 was removed, the n-side electrode 160 wafer was formed.

Then, the back surface of the substrate 110 was polished, and the wafer was cut by cleavage or diamond blade, and thereby the semiconductor light-emitting element could be formed.

As described above, in the method for producing a semiconductor light-emitting element of this example, at least in the interface side of the p-side electrode 150 to the second semiconductor layer 140, the void 210 can be formed by self-assembly according to migration of silver by high-temperature heat treatment.

That is, by the high-temperature heat treatment of the p-side electrode 150, thermal stress is generated by the thermal expansion coefficient difference between the different kinds of materials, and the stress is concentrated on the grain boundaries, and in order to relax the stress, the metal atom and the atomic vacancy of the conductive film 151 diffuse and move, and thereby, the void 210 is formed along the gain boundaries.

In this case, for improving reproducibility of formation of size and density of the void 210, it is necessary to control the migration of p-side electrode 150 (conductive film 151).

Therefore, attachment of moisture and/or ionized substance, which has the effect of promoting the migration, to the wafer is controlled.

In the producing method of this example, by keeping the wafer in a space in which the temperature and the humidity are controlled for a certain time, moisture and/or ionized substance for promoting migration (migration-promoting substance) is attached with good reproducibility. A method for keeping the wafer in a thermo-hygrostat chamber in which the temperature and the humidity can be controlled is also possible. The specific condition for attaching the migration-promoting substance is changed according to, the characteristics of the conductive film 151 and the semiconductor layer 148 to be used, the treatment conditions of the wafer, and so forth, and therefore, the specific condition is appropriately determined base thereon.

And, in the each of the steps before and after forming the p-side electrode 150, attachment in which the migration-promoting substance (moisture and/or ionized substance) is not controlled is prevented as much as possible. Specifically, for example, after each of the wet treatment steps before and after forming the p-side electrode 150, rinse by ultrapure water is sufficiently performed, and drying is sufficiently performed. Moreover, in the air blow or the spin dryer to be performed after the rinse, although the moisture on the wafer appears to have been removed, slight moisture or wet nagging around the wafer surface is left, and moreover, if the wafer is heated by a hot plate or an oven immediately before forming the conductive film 151 in the state that the resist is formed, the organic solvent evaporates from the resist and adheres to the surface of the semiconductor layer 148, and the reproducibility of the migration of the p-side electrode 150 formed thereon becomes significantly degraded, and therefore, also for the drying method, the ingenuity is required as described above.

Moreover, as described above the temperature-lowering rate in the high-temperature heat treatment and after the heat treatment is set to be low, formation of the void 210 by the migration is performed with good reproducibility.

As described above, in the method for producing a semiconductor light-emitting element of this example, by controlling the attachment of moisture and/or ionized substance having the effect for promoting the migration to the wafer and also by setting the temperature-lowering rate in the high-temperature treatment and after the heat treatment to be low, the void 210 having a width of the wavelength or less can be formed with good reproducibility.

The migration-promoting substance includes, for example, water, ionized substance (substance having relatively high ionization tendency and various compounds thereof), and various organic substances derived from the resist or the like.

Hereinafter, mechanism of formation of the void 210 by the heat treatment will be explained in detail.

Figure 9:
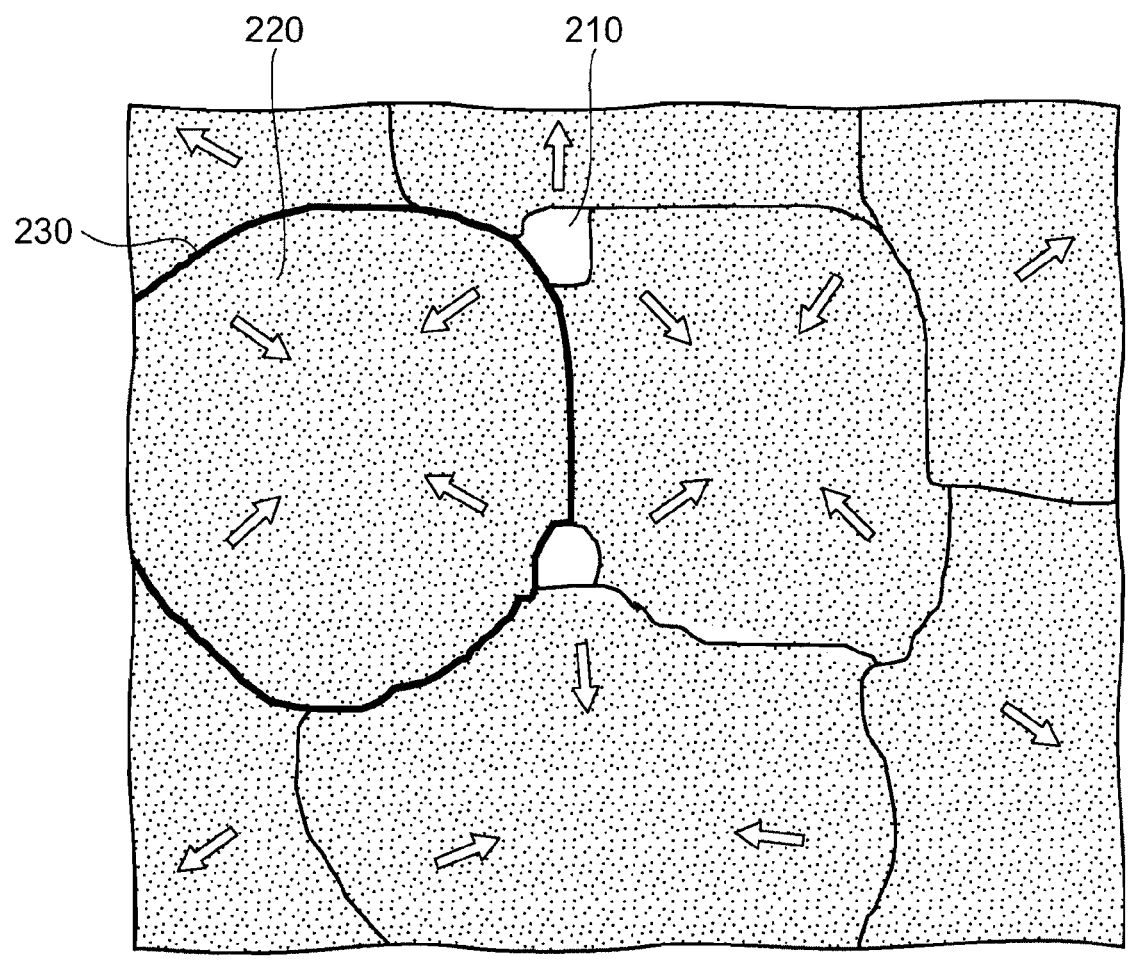
FIG. 9 is a schematic view showing behavior of crystal grain in heat treatment in the method for producing a semiconductor light-emitting element according to the second example.

FIG. 9 is a schematic view showing behavior of crystal grain in heat treatment in the method for producing a semiconductor light-emitting element according to the second example of this invention.

As shown in FIG. 9, substance that is easy to migrate such as silver shows such behavior as the surface area becomes the smallest in the heat treatment, similarly to surface tension that is a property of liquid.

That is, when the conductive film 151 (thin film of silver or silver alloy) film-formed on the semiconductor layer 148 is heat-treated, the thermal stress is generated by the thermal expansion coefficient difference between the different kinds of materials, and the metal atoms move for trying to relax the stress. In this case, because the metal atoms in the crystal grains 220 attracts each other to try to concentrate, the metal atoms in the vicinity of the gain boundary 230 diffuse and move to the center of the crystal grain 220, and the void 210 is generated in the grain boundaries 230.

And, the surface roughness of the conductive film 151 is, for example, about 1.5 nm before the heat treatment, but after the heat treatment, the crystal grains 220 somewhat get moving, and therefore, the surface roughness increases to be, for example, about 2.5 nm. When the heat treatment temperature is raised, the diffusion rate of the metal atoms becomes rapid according to Arrhenius' law, but the stress due to thermal stress becomes small. Moreover, because another equilibration reaction in which the crystal grains 220 are connected one another is also generated, the width of the void 210 and the density of the void 210 in the plane of the p-side electrode 150 become a local maximal value in a certain heat treatment temperature.

The width of the void 210, and the density and the area ratio in the plane of the p-side electrode 150 can be controlled by the state of the migration-promoting substance (namely, condition of the step for keeping the wafer for a certain time before the heat treatment, and so forth), the heat treatment (temperature, time, and temperature rising and lowering rates of the heat treatment), type, film thickness, and multilayer structure of the conductive film 151, and so forth.

If a multilayer structure in which silver or silver alloy that is easy to migrate is used as the p-side electrode 150 at least in the interface side to the semiconductor layer 148 as described above, the void 210 can be formed in the interface of the semiconductor layer 148 side.

As described previously, the optical output is changed corresponding to density and area ratio of the void 210, and therefore, the above-described production condition can be changed considering the productivity and the optical output efficiency.

As described above, by adopting the electrode sintering process (high-temperature heat treatment process) in which silver contained in the p-side electrode easily migrates, the diffusion reflection region (void 210) can be formed by self-assembly, and the semiconductor light-emitting element can be realized at low cost.

FIRST COMPARATIVE EXAMPLE

Next, a structure of the semiconductor light-emitting element of a first comparative example and the producing method thereof will be explained.

Figure 10:
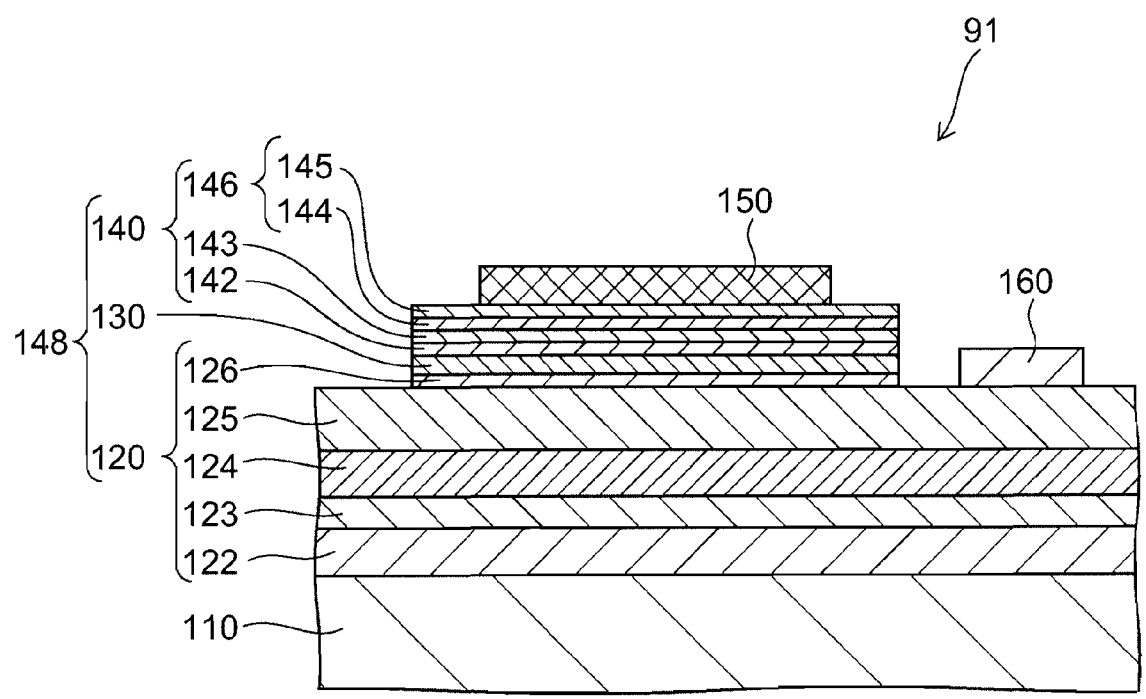
FIG. 10 is a sectional schematic view illustrating a structure of the semiconductor light-emitting element of the first comparative example.

FIG. 10 is a sectional schematic view illustrating a structure of the semiconductor light-emitting element of the first comparative example.

As shown in FIG. 10, in the semiconductor light-emitting element 91 of the first comparative example, the void 210 is not provided in the second electrode 150. The structure except for this point is the same as the semiconductor light-emitting element 11 of the first example illustrated in FIG. 4, and the explanation thereof will be omitted.

Hereinafter, the method for producing the semiconductor light-emitting element 91 of the first comparative example will be explained. In the method for producing the semiconductor light-emitting element of the first comparative example, the steps until forming the semiconductor layer 148 can be the same as the method for producing the semiconductor light-emitting element of the second example, and therefore, the producing method after the steps will be explained.

FIGS. 11A to 11E are schematic views following the steps illustrating the method for producing the semiconductor light-emitting element of the first comparative example.

Figure 11A:
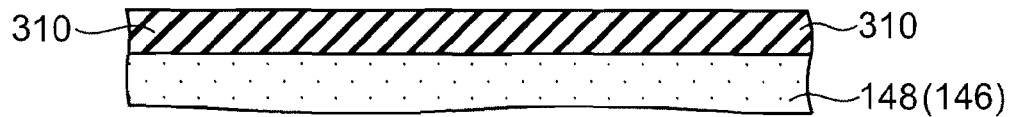
FIGS. 11A to 11E are schematic views following the steps illustrating the method for producing the semiconductor light-emitting element of the first comparative example.
Figure 11B:
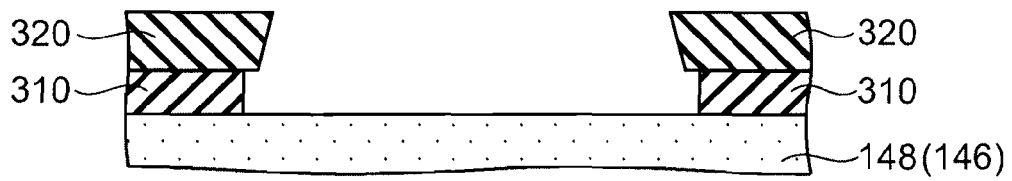
Figure 11C:
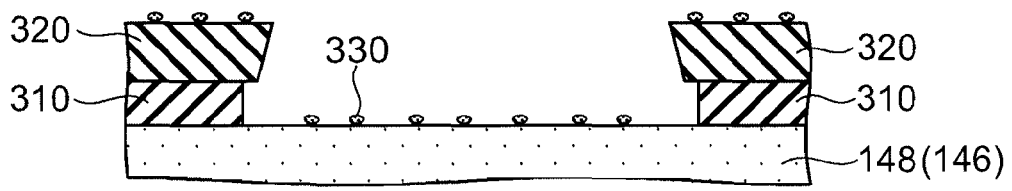
Figure 11D:
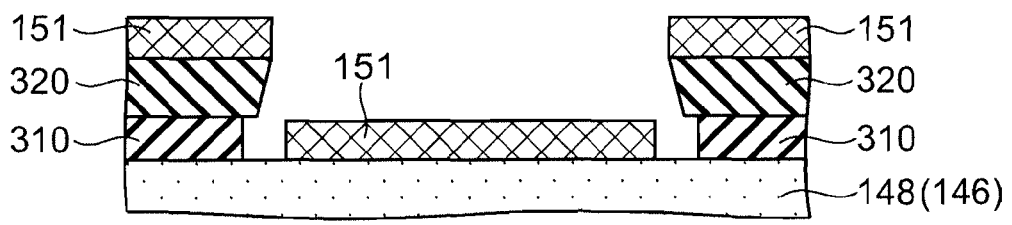
Figure 11E:
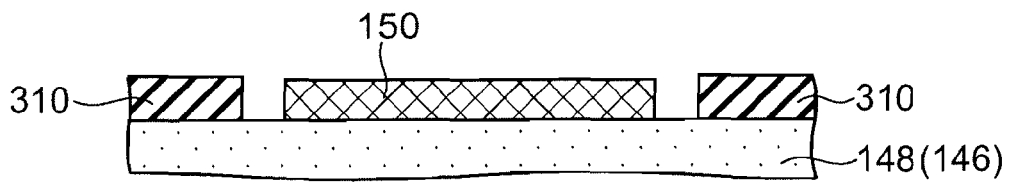

FIG. 11A is a view of a first step, and FIGS. 11B and 11E are views following the preceding views, respectively.

FIG. 11A is an enlarged view of the region 300 in which the SiO$_2$ film 310 is formed on the semiconductor layer.

First as shown in FIG. 11B, similarly to the first example, on the semiconductor layer 148 on which the SiO$_2$ film 310 is formed, the lift-off resist 320 is formed in a predetermined pattern, and some of the SiO$_2$ film 310 on the p-type GaN contact layer 146 was removed by ammonium fluoride treatment, and moisture on the wafer was blown off by an air blow or a spin dryer or the like.

In this state, as shown in FIG. 11C, a little moisture remains on the wafer surface in the state of being not controlled.

And, as shown in FIG. 11D, by a vacuum deposition apparatus, on the entire wafer, Ag, Pt, and Ti were film-formed in this order at a total film-thickness of 200 nm, and thereby, a conductive film 151 for forming the p-side electrode 150 was formed.

And, as shown in FIG. 11E, the resist 320 was dissolved by an organic solvent, and thereby, only the conductive film 151 formed on the resist 320 was removed and rinsed by ultrapure water, and then, the wafer was dried. Thereby, the p-side electrode 150 was formed in the region in which the SiO$_2$ film 310 was removed.

And, then, by using an RTA apparatus, temperature of the wafer was raised to 350° C. at 5° C./second in a nitrogen atmosphere, and the wafer was subjected to heat treatment for 1 minute in the nitrogen atmosphere at 350° C., and the temperature was lowered to the normal temperature at 0.5° C./second. Thereby, the semiconductor light-emitting element 91 of the first comparative example illustrated in FIG. 10 was formed.

That is, in the method for producing the semiconductor light-emitting element 91 of the first comparative example, the drying step before forming the conductive film 151 for the p-side electrode 150 as illustrated in FIG. 7D and the step of attaching the migration-promoting substance as illustrated in FIG. 8C in the producing method of the second example of this invention are omitted.

Hereinafter, evaluation results of the semiconductor light-emitting element 11 of the first example formed as described above and the semiconductor light-emitting element 91 of the first comparative example will be explained.

Figure 12A:
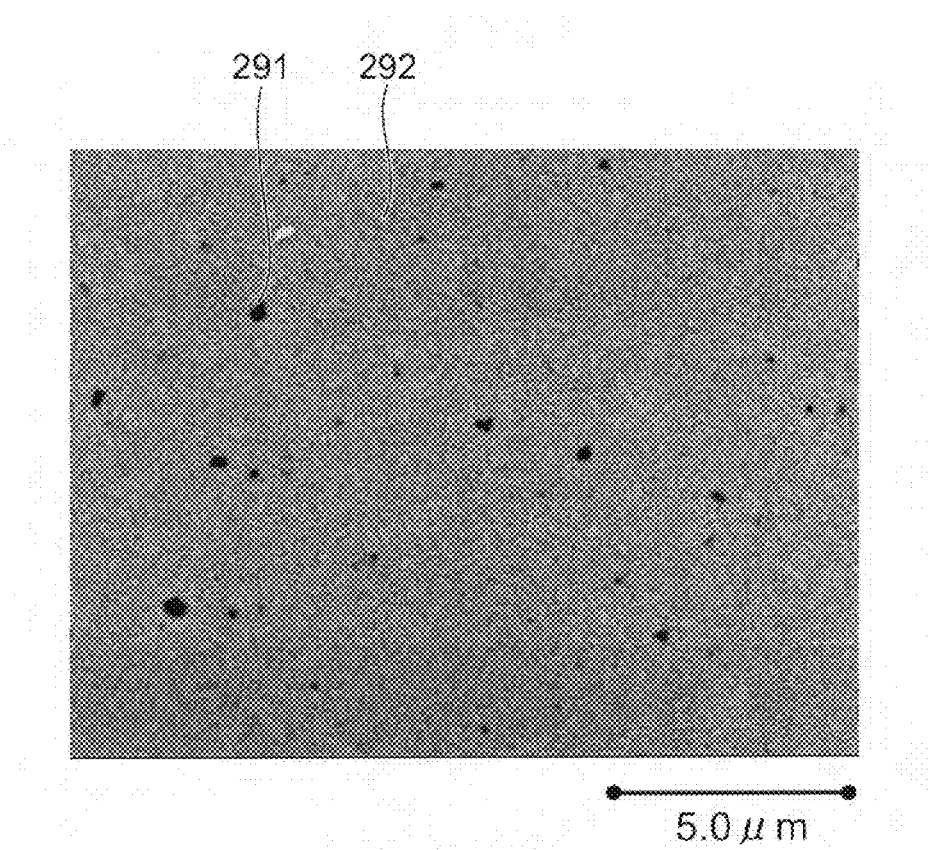
FIGS. 12A and 12B are scanning electron micrographs illustrating the structures of the surfaces of the second electrodes according to the first example and the first comparative example.
Figure 12B:
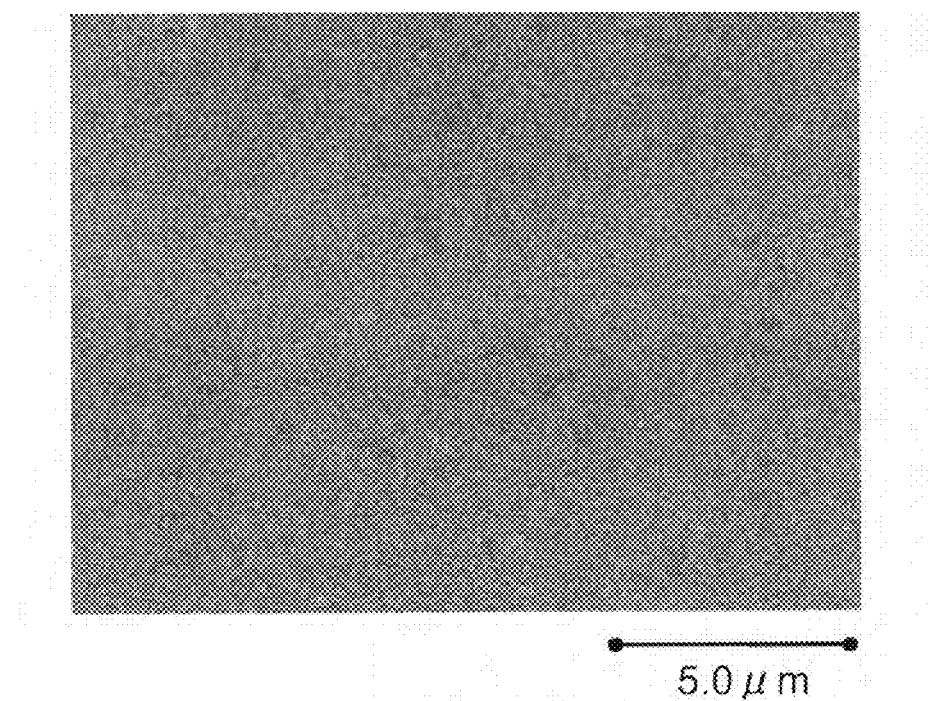

FIGS. 12A and 12B are scanning electron micrographs illustrating the structures of the surfaces of the second electrodes of the semiconductor light-emitting element according to the first example of this invention and the semiconductor light-emitting element of the first comparative example.

That is, FIG. 12A corresponds to the semiconductor light-emitting element 11 of the first example, and the FIG. 12B corresponds to the semiconductor light-emitting element 91 of the first comparative example.

As shown in FIG. 12B, in the second electrode (p-side electrode) 150 in the semiconductor light-emitting element 91 of the first comparative example, no distinguishing image was confirmed, and the surface state was the same as the state before the heat treatment. That is, the void was not formed in the p-side electrode 150 of the semiconductor light-emitting element 91. And, in the evaluation of the surface roughness by the atom force microscope, the surface roughness was about 1.7 nm, which was the same as the surface roughness before the heat treatment.

On the other hand, as shown in FIG. 12A, in the p-side electrode 150 of the semiconductor light-emitting element 11, granular image (parts whose brightness is low in the figure) 291 was observed. For the size of the granular image 291 in the planar view, the diameter thereof was about 0.3 μm on an average. As a result of performing further analysis by a scanning electron microscope or an atomic force microscope, it was found that the upper side (opposite surface to the second semiconductor layer 120) of the granular image 291 is relatively flat and the surface roughness of the surface of the upper side of the part of the granular image 291 is about 2.6 nm, which is the same as the region except for the granular image 291, and that the granular image 291 is the void 210 formed in the interface of the p-side electrode 150 to the semiconductor layer 140. And, it was found that the upper side of the void 210 (the opposite side to the second semiconductor layer 140) is capped by the p-side electrode 150.

And, the void 210 was formed in the grain boundaries 230 of the silver alloy of the p-side electrode 150.

In the semiconductor light-emitting element 11 according to this example, as the p-side electrode 150, the conductive film 151 composed of Ag, Pt, and Ti is used. By the high-temperature heat treatment, Ag and Pt diffused to each other, but the metal layer having titanium as the main component is left in the surface, and by migration of Ag alloy, the void 210 is formed in the grain boundaries 230.

The area ratio of the void 210 in the plane of the p-side electrode 150 was about 0.9%.

The flat region (gray level part of brightness in the figure) 292 having no void 210 shows an ohmic characteristic and a high efficient mirror-reflection characteristic, and the void 210 shows a diffuse reflection characteristic. In the void 210, there is vacuum or a nitrogen gas of the heat treatment atmosphere, and the refraction indices of the both cases are thought to be about 1, and therefore, the refraction index difference between the void and the p-type GaN contact layer 146 is large and the structure easily generates total internal reflection.

Moreover, because there is no light absorber in the void 210, absorption loss is small by repeating the reflection. Furthermore, in the void 210, it is thought that there is little moisture and little ionized substance, degradation of the p-side electrode 150 can be suppressed and therefore the reliability is improved.

By these effects, according to the semiconductor light-emitting element 11 according to the first example, the semiconductor light-emitting element with high light taking-out efficiency and high reliability can be provided.

Third Embodiment

Hereinafter, a third embodiment of this invention will be explained.

Figure 13:
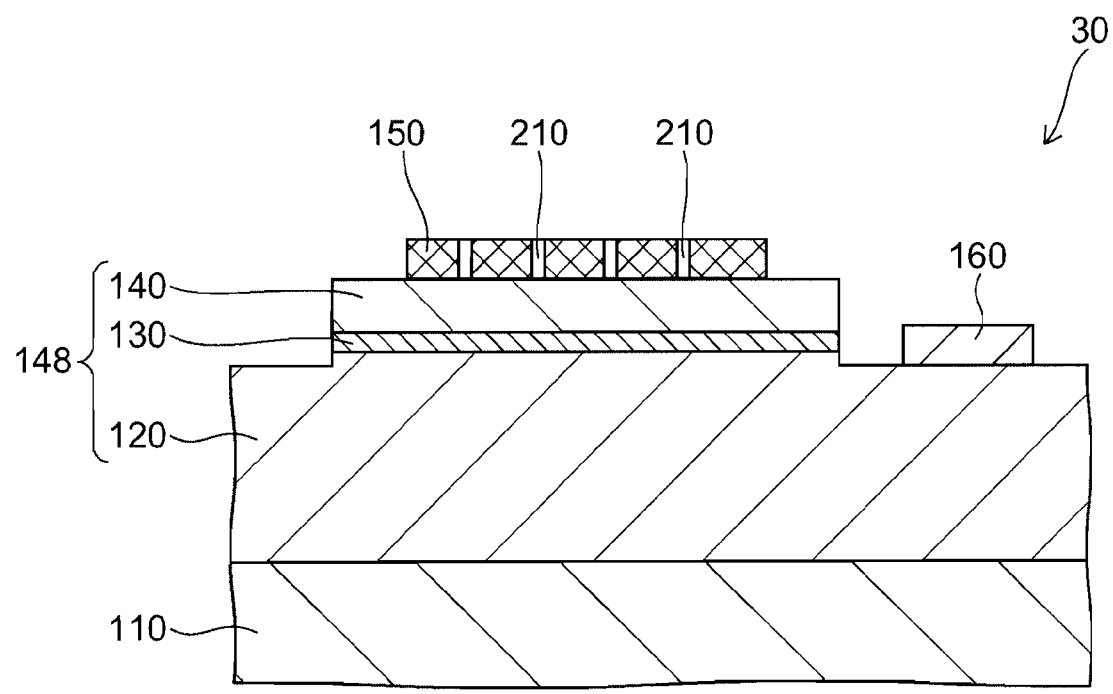
FIG. 13 is a sectional schematic view illustrating a structure of the semiconductor light-emitting element according to a third embodiment of this invention.

FIG. 13 is a sectional schematic view illustrating a structure of the semiconductor light-emitting element according to a third embodiment of this invention.

As shown in FIG. 13, in the semiconductor light-emitting element 30 according to the third embodiment of this invention, the void 210 of the second electrode (p-side electrode) 150 is provided not only in the interface to the second semiconductor layer 140 but also continuously to the opposite surface to the second semiconductor layer 140 of the p-side electrode 150. That is, the void 210 is provided so as to pass through the layer of the p-side electrode 150 in the film-thickness direction. The semiconductor light-emitting element 30 has the same structure as the semiconductor light-emitting element 10 according to the first embodiment illustrated in FIGS. 1A and 1B except for the shape of the void 210, and also, the planar structure of the semiconductor light-emitting element 30 can be the same as the semiconductor light-emitting element 10, the explanation thereof will be omitted.

As described above, also by the semiconductor light-emitting element 30 in which the void 210 is provided so as to pass through the p-side electrode 150 continuously in the thickness direction of the p-side electrode 150, the light path of the light generated in the light-emitting layer 130 can be changed by the void 210, and the light-trapping effect by the total internal reflection in the interface having the refraction index difference can be suppressed, and the semiconductor light-emitting element with high light taking-out efficiency can be provided.

Also, in the semiconductor light-emitting element 30 of this embodiment, by using the single crystal AlN buffer layer (the first AlN buffer layer 122, the second AlN buffer layer 123 of high purity, and the non-doped GaN buffer layer 124), differently from the low-temperature growth AlN buffer layer that is amorphous or polycrystalline, the buffer layer is difficult to become an absorber to the emitted light, and the defects in the semiconductor layer can be reduced, and the factor causing light absorption in the semiconductor layer can be reduced as much as possible. Thereby, the emitted light can repeat reflection at many times in the interface between the epitaxial layer (semiconductor layer 148) and the p-side electrode 150, and therefore, the emitted light is trapped in the epitaxial layer (semiconductor layer 148) and easily affected by the effect in the 210, and thereby, even if the density or the area ratio of the void 210 is low, high light taking-out efficiency can be obtained.

THIRD EXAMPLE

Hereinafter, the method for producing the semiconductor light-emitting element having this structure will be explained.

The method for producing the semiconductor light-emitting element of the third example is partial modification of the method for producing the semiconductor light-emitting element of the second example illustrated in FIGS. 6A to 8D. And, in this case, the heat treatment temperature of the p-side electrode 150 is changed to change the density of the void 210, and the relation between the void 210 and the optical output was investigated.

FIG. 14A to 14G are schematic sectional views following step sequence of the substantial part illustrating the method for producing a semiconductor light-emitting element according to the third example of this invention.

Figure 14A:
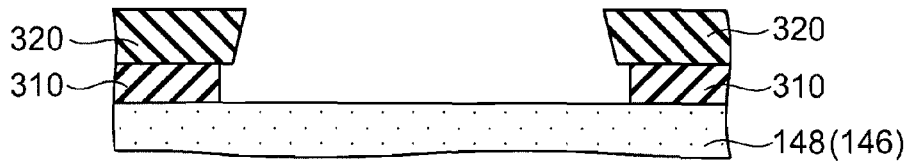
FIGS. 14A to 14G are schematic sectional views following step sequence of the substantial part illustrating the method for producing a semiconductor light-emitting element according to the third example.
Figure 14B:
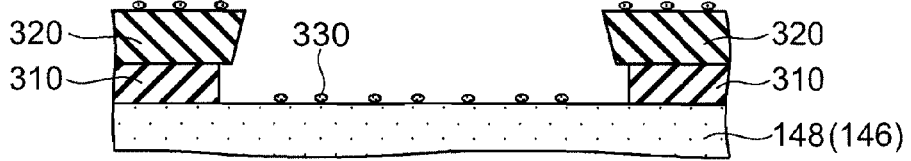
Figure 14C:
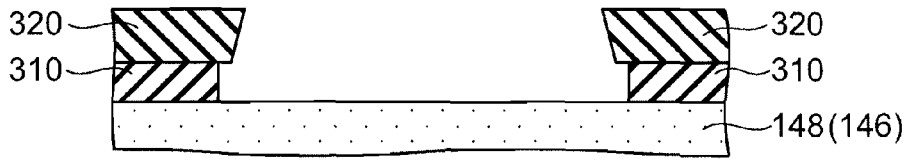
Figure 14D:
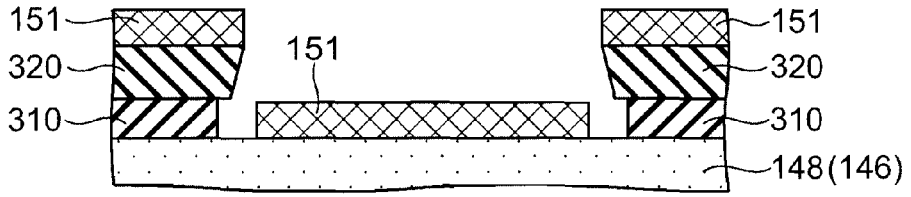
Figure 14E:
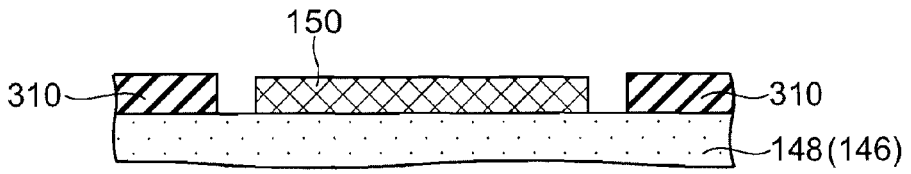
Figure 14F:
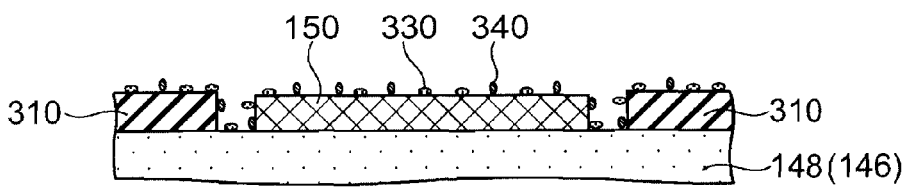
Figure 14G:
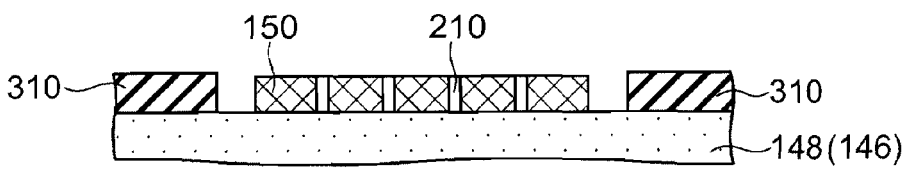

FIG. 14A is a view of a first step, and FIGS. 14B and 14G are views following the preceding views, respectively.

That is, as shown in FIG. 14A, the $SiO_2$ film 310 was provided on the semiconductor layer 148, and then for forming the p-side electrode 150, the patterned lift-off resist 320 was formed on the semiconductor layer 148, and some of the $SiO_2$ film on the p-type GaN contact layer 146 was removed by ammonium fluoride treatment.

In this case, as shown in FIG. 14B, in the state that the moisture on the wafer is merely blown off, a little moisture remains on the wafer surface in the state of being not controlled.

Then, as shown in FIG. 14C, the moisture on the wafer is sufficiently dried and removed.

And, as shown in FIG. 14D, by a vacuum deposition apparatus, on the entire wafer, an Ag monolayer was formed at a film-thickness of 200 nm.

And, as shown in FIG. 14E, the resist 320 was dissolved by an organic solvent, and thereby, only the conductive film 151 formed on the resist 320 was removed and sufficiently rinsed by ultrapure water, and then, the wafer was sufficiently dried on a hot plate at 120° C. Thereby, the p-side electrode 150 was formed in the region in which the $SiO_2$ film 310 was removed.

And, as shown in FIG. 14F, the wafer was kept in a clean room in which the temperature and the humidity were controlled to be 25° C.±1° C. and 50%±1% respectively for 24 hours, and thereby, a little moisture 330 or ionized substance 340 was attached to the surface of the formed p-side electrode 150.

And, as shown in FIG. 14G, by using an RTA apparatus, the heat treatment was performed for 1 minute in an nitrogen atmosphere by three kinds of temperatures of 450° C., 700° C., and 800° C., and the temperature was lowered at 5° C./second to the normal temperature, and thereby, the void 210 was formed in the interface between the p-type GaN contact layer 146 and the p-side electrode 150.

Then, similarly to the second example, the first electrode (n-side electrode) 160 was formed in the same method as the second example, and thereby, the semiconductor light-emitting element of this example was formed.

That is, in the case of the second example, the p-side electrode was Ag, Pt, and Ti, and the heat treatment temperature by RTA was 800° C. However, this example is different in the points that the p-side electrode 150 was an Ag monolayer and that the heat treatment temperature by RTA was changed to be the three kinds of 450° C., 700° C., and 800° C.

Figure 15:
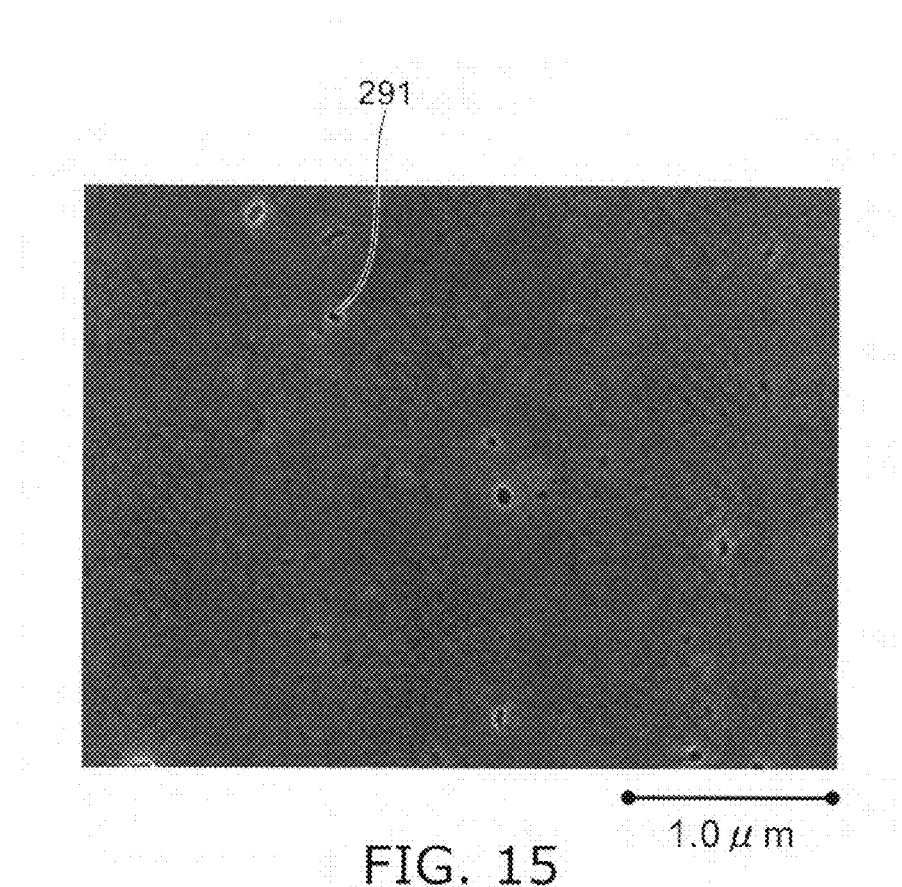
FIG. 15 is a scanning electron micrograph illustrating the structure of the surface of the second electrode of the semiconductor light-emitting element according to the third example.

FIG. 15 is a scanning electron micrograph illustrating the structure of the surface of the second electrode of the semiconductor light-emitting element according to the third example of this invention.

That is, FIG. 15 is a photograph of a scanning electron microscopy imaging of the surface of the p-side electrode 150 of the semiconductor light-emitting element formed at the heat treatment temperature of 800° C.

As shown in FIG. 15, granular images 291 having about a diameter of 0.1 μm on an average were observed. As a result of performing further analysis by a scanning electron microscope or an atomic force microscope, it was found that in the grain boundaries 230 of silver, a void 210 like a hole passing from the surface of the p-side electrode 150 to the p-type GaN contact layer 146 was formed. That is, it was found that by high-temperature heat treatment, Ag of the p-side electrode 150 migrated and the void 210 was formed in the grain boundaries 230.

Hereinafter, the evaluation result of the semiconductor light-emitting element by the above-described method for producing a semiconductor light-emitting element according to the first example will be explained.

Figure 16:
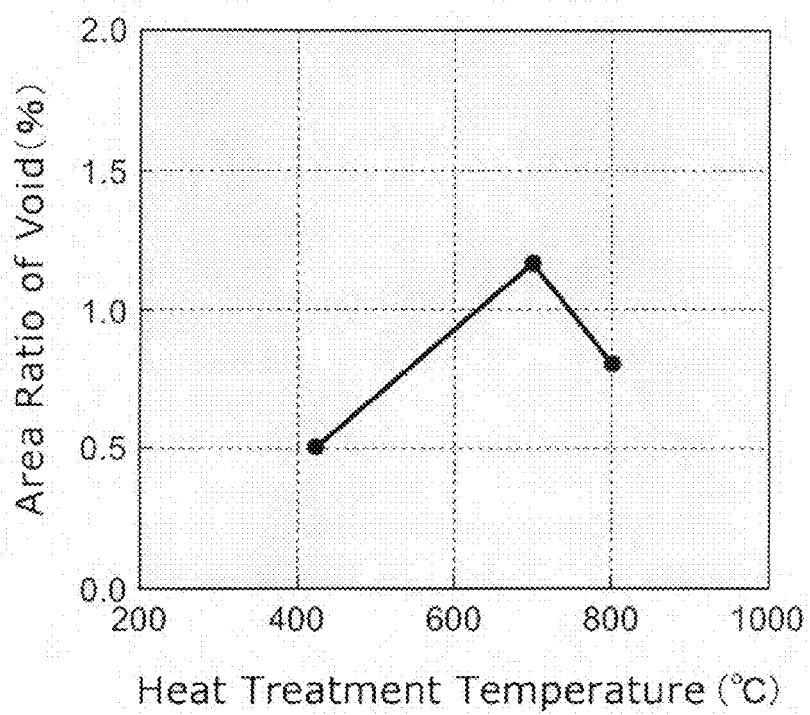
FIG. 16 is a graphic view illustrating the relation between the heat treatment temperature in the semiconductor light-emitting element according to the third example and the area ratio of the void of the element.

FIG. 16 is a graphic view illustrating the relation between the heat treatment temperature in the semiconductor light-emitting element according to the third example of this invention and the area ratio of the void of the semiconductor light-emitting element.

In FIG. 16, the horizontal axis represents temperature of RTA heat treatment, and the vertical axis represents area ratio of the void 210 in the p-side electrode 150.

As shown in FIG. 16, in the semiconductor light-emitting element of the third example, the area ratios of the void 210 in the plane of p-side electrode 150 were 0.5%, 1.2%, 0.8% in the heat treatment temperatures of 450° C., 700° C., and 800° C., respectively. As described above, the area ratio of the void 210 indicates a local maximum value in the heat treatment temperature of 700° C.

When the heat treatment temperature is raised, the diffusion rate of the metal atoms by following Arrhenius' law becomes rapid, but the stress by the thermal stress becomes small. Moreover, because another equilibration reaction that the crystal grains 220 bind to one another is also generated, the area ratio of the void 210 in the p-side electrode 150 indicates a local maximum value in a certain temperature as described above. In this example, the area ratio of the void 210 indicated the local maximum value in the heat treatment temperature of 700° C.

Figure 17:
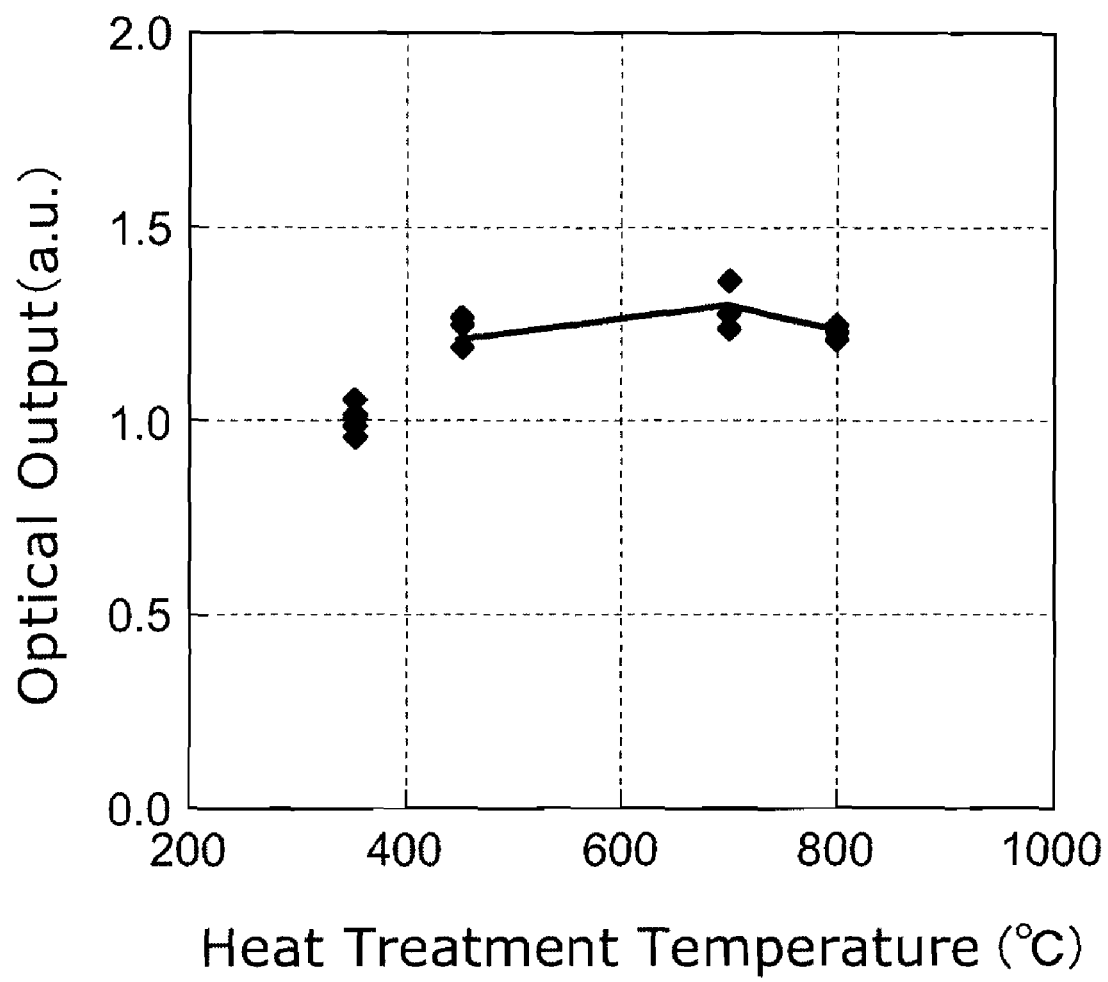
FIG. 17 is a graphic view illustrating the relation between the heat treatment temperature and the optical output of the element according to the third example.

FIG. 17 is a graphic view illustrating the relation between the heat treatment temperature and the optical output of the semiconductor light-emitting element in the semiconductor light-emitting element according to the third example of this invention.

In FIG. 17, the horizontal axis represents temperature of RTA heat treatment, and the vertical axis represents optical output of the semiconductor light-emitting element. The data that the heat treatment temperature in the figure is 350° C. represents the data of the comparative example in which the void is not formed in the p-side electrode 150.

And, this figure illustrates the optical output of the semiconductor light-emitting element of this example as the relative ratio so that the optical output of the semiconductor light-emitting element of comparative example in which the void 210 is not formed in the p-side electrode 150 is 1.

As shown in FIG. 17, it was found that in the semiconductor light-emitting element of this example, the optical output is large compared to the comparative example having no void, and that by forming the void 210, the optical output is improved by about 30% at the maximum.

As described above, according to the semiconductor light-emitting element of this example, the semiconductor light-emitting element with high light taking-out efficiency can be provided.

SECOND AND THIRD COMPARATIVE EXAMPLES

Hereinafter, as the comparative examples, the semiconductor light-emitting elements of a second comparative example in which the void is not formed and a third comparative example in which the huge void with bad reproducibility is formed will be explained.

FIGS. 18A to 18E are schematic sectional views following step sequence of the substantial part illustrating the method for producing a semiconductor light-emitting element of the second comparative example.

Figure 18A:
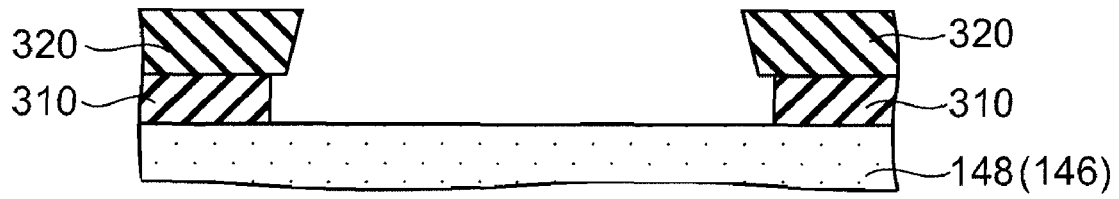
FIGS. 18A to 18E are schematic sectional views following step sequence of the substantial part illustrating the method for producing a semiconductor light-emitting element of the second comparative example.

FIG. 18A is a view of a first step, and FIGS. 18B to 18E are views following the preceding views, respectively.

Figure 18B:
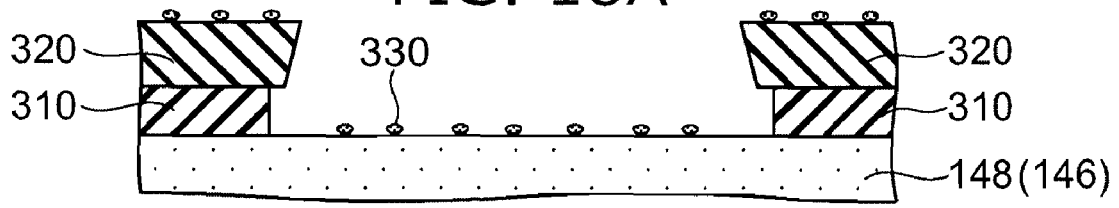

As shown in FIG. 18B, after the SiO$_2$ film 310 is formed on the semiconductor layer 148, a lift-off resist 320 is formed in a predetermined pattern, and some of the SiO$_2$ film 310 on the p-type GaN contact layer 146 was removed by ammonium fluoride treatment, and moisture on the wafer was blown off by an air blow or a spin dryer or the like.

In this case, as shown in FIG. 18B, in the state that the moisture on the wafer is merely blown off, a little moisture remains on the wafer surface in the state of being not controlled.

Figure 18C:
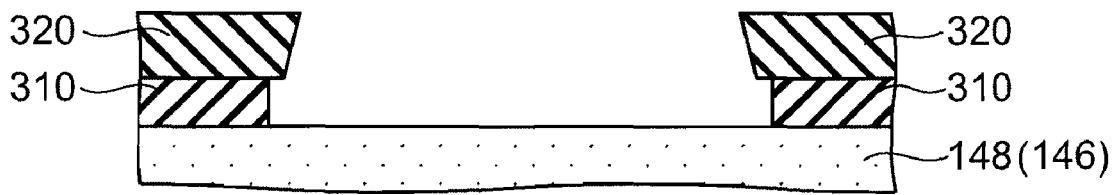

Therefore, then, as shown in FIG. 18C, the moisture on the wafer is sufficiently dried and removed.

Figure 18D:
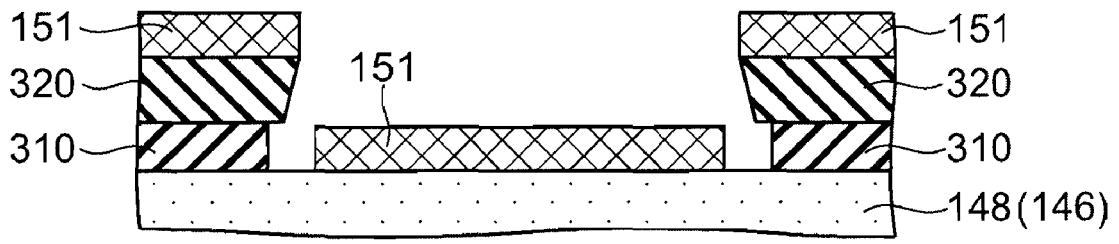

As shown in FIG. 18D, by a vacuum deposition apparatus, on the entire wafer, a silver monolayer (the conductive film 151) was formed at a film-thickness of 200 nm, and then, the resist 320 was dissolved by an organic solvent, and thereby, only the conductive film 151 formed on the resist 320 was removed and sufficiently rinsed by ultrapure water, and then, the wafer was sufficiently dried on a hot plate at 120° C. Thereby, the p-side electrode 150 was formed in the region in which the SiO$_2$ film 310 was removed.

Figure 18E:
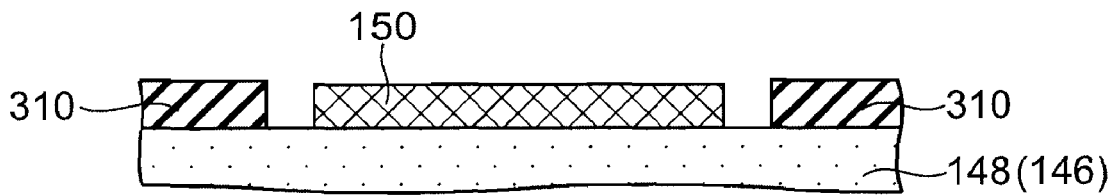

And, as shown in FIG. 18E, by using an RTA apparatus, temperature of the wafer was raised to 800° C. at 5° C./second in a nitrogen atmosphere, and the wafer was subjected to heat treatment for 1 minute in the nitrogen atmosphere at 800° C., and the temperature was lowered to the normal temperature at 0.5° C./second.

That is, in the method for producing the semiconductor light-emitting element of the second comparative example, the step for attaching the migration-promoting substance illustrated in FIG. 14F in the method for producing the semiconductor light-emitting element of the third example of this invention is omitted.

FIGS. 19A to 19E are schematic sectional views following step sequence of the substantial part illustrating the method for producing a semiconductor light-emitting element of the second comparative example.

Figure 19A:
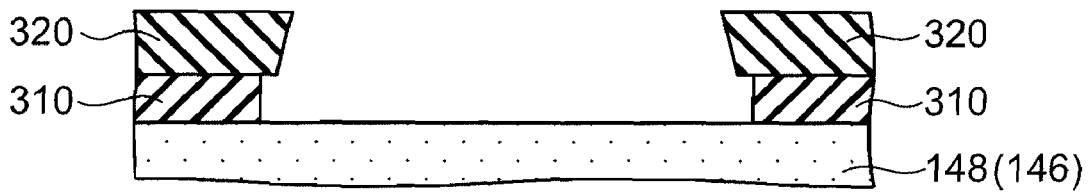
FIGS. 19A to 19E are schematic sectional views following step sequence of the substantial part illustrating the method for producing a semiconductor light-emitting element of the second comparative example.

FIG. 19A is a view of a first step, and FIGS. 19B to 19E are views following the preceding views, respectively.

As shown in FIG. 19A, after the SiO$_2$ film 310 is formed on the semiconductor layer 148, a lift-off resist 320 is formed in a predetermined pattern, and some of the SiO$_2$ film 310 on the p-type GaN contact layer 146 was removed by ammonium fluoride treatment, and moisture on the wafer was blown off by an air blow or a spin dryer or the like.

Figure 19B:
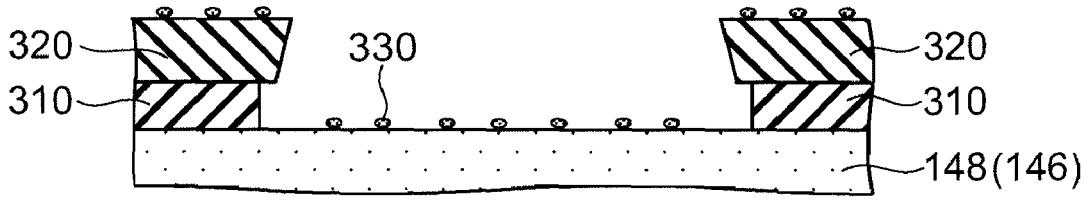

In this case, as shown in FIG. 19B, in the state that the moisture on the wafer is merely blown off, a little moisture remains on the wafer surface in the state of being not controlled.

Figure 19C:
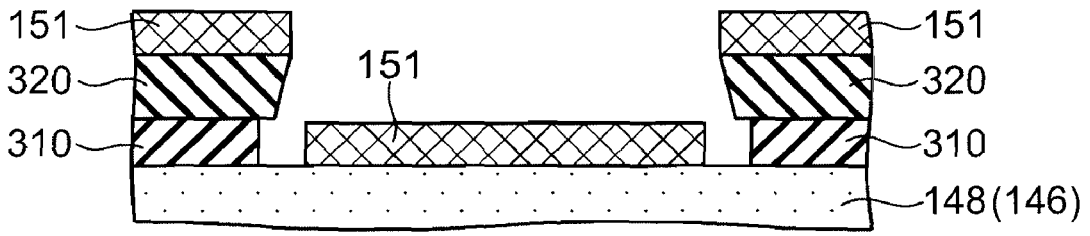

And, as shown in FIG. 19C, by a vacuum deposition apparatus, on the entire wafer, a silver monolayer (the conductive film 151) was formed at a film-thickness of 200 nm.

Figure 19D:
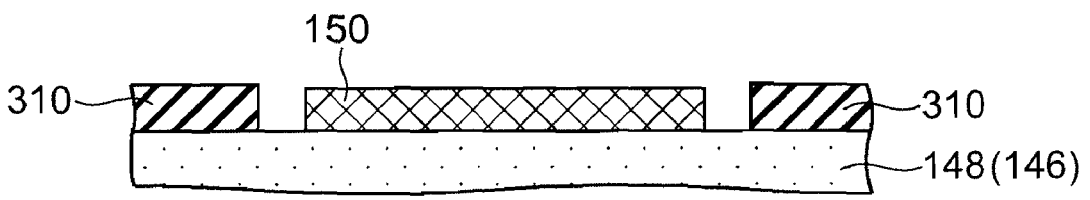

And, as shown in FIG. 19D, the resist 320 was dissolved by an organic solvent, and thereby, only the conductive film 151 formed on the resist 320 was removed and sufficiently rinsed by ultrapure water, and then, the wafer was sufficiently dried on a hot plate at 120° C. Thereby, the p-side electrode 150 was formed in the region in which the SiO$_2$ film 310 was removed.

Figure 19E:
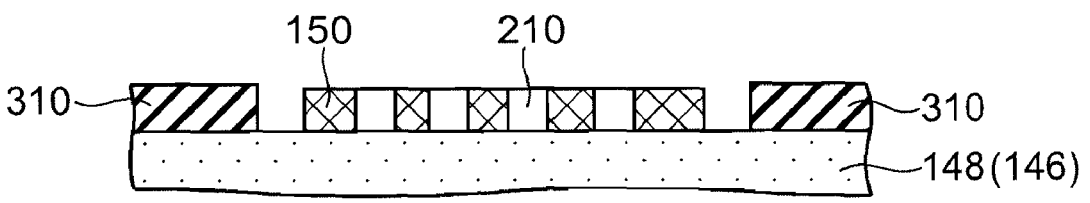

And, as shown in FIG. 19E, by using an RTA apparatus, temperature of the wafer was raised to 800° C. at 5° C./second in a nitrogen atmosphere, and the wafer was subjected to heat treatment for 1 minute in the nitrogen atmosphere at 800° C., and the temperature was lowered to the normal temperature at 0.5° C./second.

That is, in the method for producing the semiconductor light-emitting element of the third comparative example, the drying step before film-forming the conductive film 151 for the p-side electrode 150 illustrated in FIG. 14C and the step for attaching the migration-promoting substance illustrated in FIG. 14F in the method for producing the semiconductor light-emitting element of the third example of this invention are omitted.

Figure 20A:
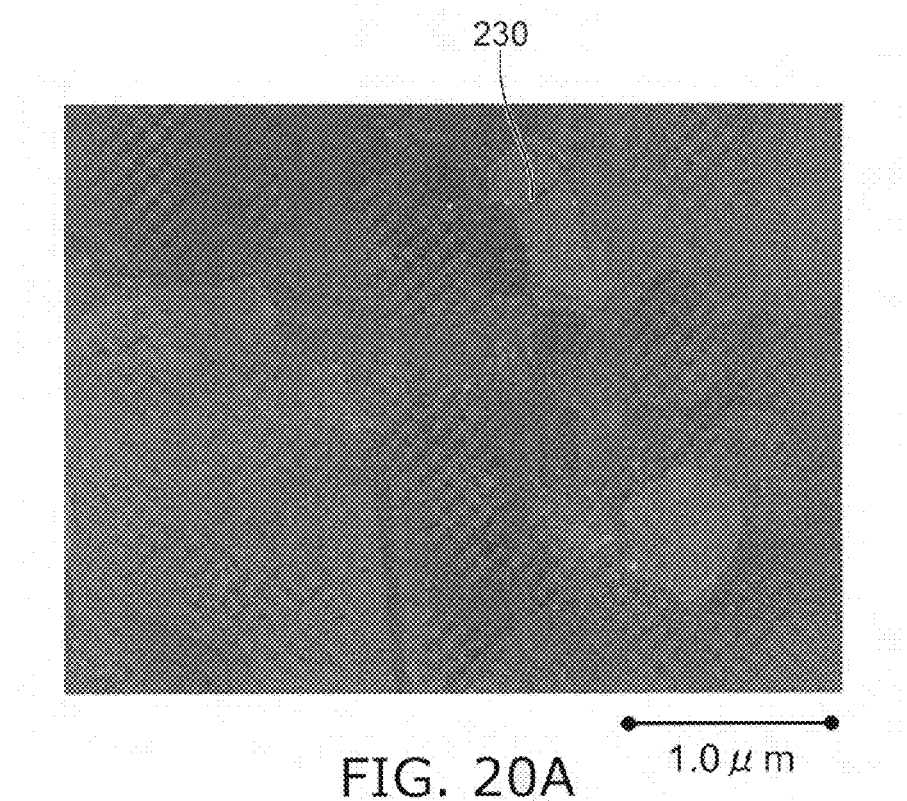
FIGS. 20A and 20B are scanning electron micrographs illustrating structures of the surfaces of the second electrodes of the semiconductor light-emitting elements of the second and third comparative examples.
Figure 20B:
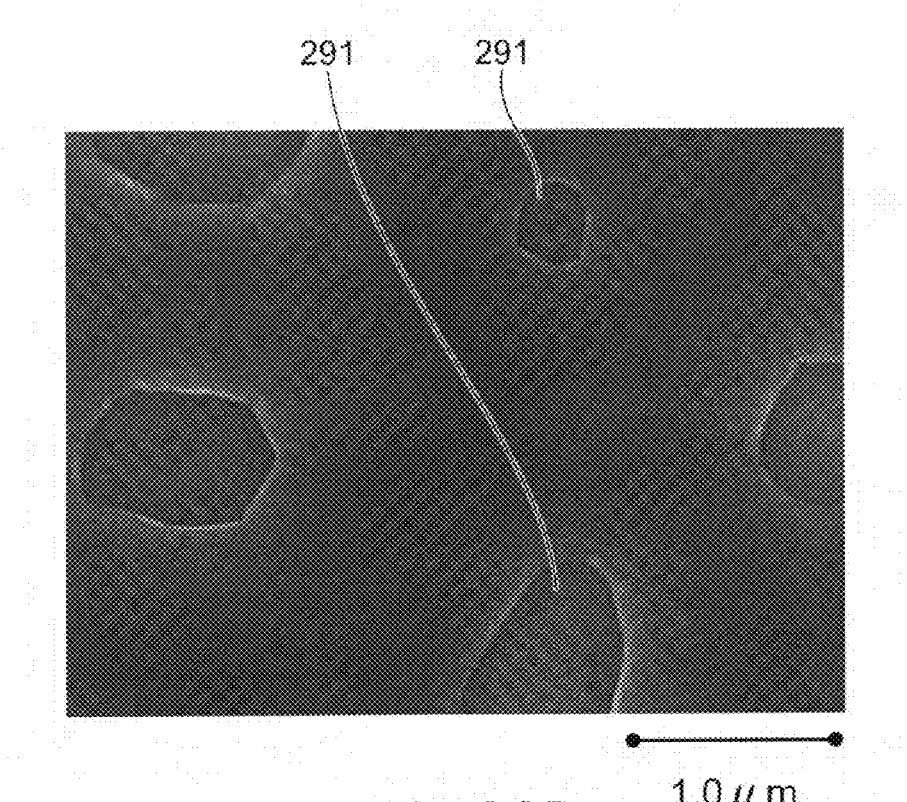

FIGS. 20A and 20B are scanning electron micrographs illustrating structures of the surfaces of the second electrodes of the semiconductor light-emitting elements of the second and third comparative examples.

That is, FIG. 20A corresponds to the second comparative example and FIG. 20B corresponds to the third comparative example.

As shown in FIG. 20A, in the semiconductor light-emitting element of the second comparative example, before forming the conductive film 151 to be the p-side electrode 150, sufficient drying was performed, and thereby the process for suppressing the migration was performed, and therefore, despite the same electrode structure as the second example and the heat treatment condition of 800° C., the void was not formed at all. The image that can be seen in the figure is the grain boundary 230.

On the other hand, as shown in FIG. 20B, in the semiconductor light-emitting element of the third comparative example, despite the same electrode structure as the second example and the heat treatment condition of 800° C., the size (width) of the void enlarged to about 1 μm. Moreover, at a plurality of times, the semiconductor light-emitting elements of the third comparative example were produced by the same process flow, but size and density of the void 210 did not have the reproducibility.

It is thought that in the third comparative example, because the conductive film 151 to be the p-side electrode 150 was formed in the state of not sufficiently performing drying and the heat treatment was performed without sufficiently performing drying after the lift-off process, the migration of silver was excessively promoted and the void 210 became huge. Moreover, when the drying state was good by accident despite the same process flow, the size of the void 210 was suppressed, and consequently, the size of the void could not be controlled.

As shown in the above-described semiconductor light-emitting elements of the second comparative example and the third comparative example, when the particular treatment such as the drying step before film-forming the conductive film 151 for the p-side electrode 150 or the step for attaching the migration-promoting substance is not performed, the void 210 is not formed or the huge void 210 with low reproducibility becomes formed. Therefore, in forming the semiconductor light-emitting element according to this embodiment, the particular treatments such as the drying step before film-forming the conductive film 151 for the p-side electrode 150 and the step for attaching the migration-promoting substance are required as explained in the third example.

FOURTH EXAMPLE

Hereinafter, the semiconductor light-emitting element according to the fourth example will be explained.

In the semiconductor light-emitting element (not shown in a figure) of this example, the material used for the p-side electrode 150 is changed to Ag and Pt with respect to the semiconductor light-emitting element 30 according to the third embodiment explained previously. And, the other structure is the same as the semiconductor light-emitting element 30 according to the third embodiment, and the explanation thereof will be omitted.

The method for producing the substantial part of the semiconductor light-emitting element 31 according to this example is as follows.

First, some of the SiO₂ film was removed by ammonium fluoride treatment, and the moisture on the wafer was blown off, a little moisture remaining on the wafer surface was sufficiently dried and removed. And, for forming the p-side electrode 150, a thin film (the conductive film 151) was formed in the order of Ag and Pt at a total film-thickness of 200 nm by a vacuum deposition apparatus on the entire wafer. And, by the lift-off method, the p-side electrode 150 was formed in the region in which the SiO₂ film 310 was removed. And, the wafer was kept in a clean room in which the temperature and the humidity were controlled to be 25° C.±1° C. and 50%±1% respectively for 24 hours, and thereby, the migration-promoting substance (a little moisture 330 and/or ionized substance 340) was attached. Then, by using an RTA apparatus, the heat treatment was performed for 1 minute in a nitrogen atmosphere of 800° C., and thereby, the void 210 was formed in the p-side electrode 150. That is, by the same condition as the semiconductor light-emitting element of the third example except for changing the material of the conductive film 151, the semiconductor light-emitting element according to this example was produced.

Figure 21:
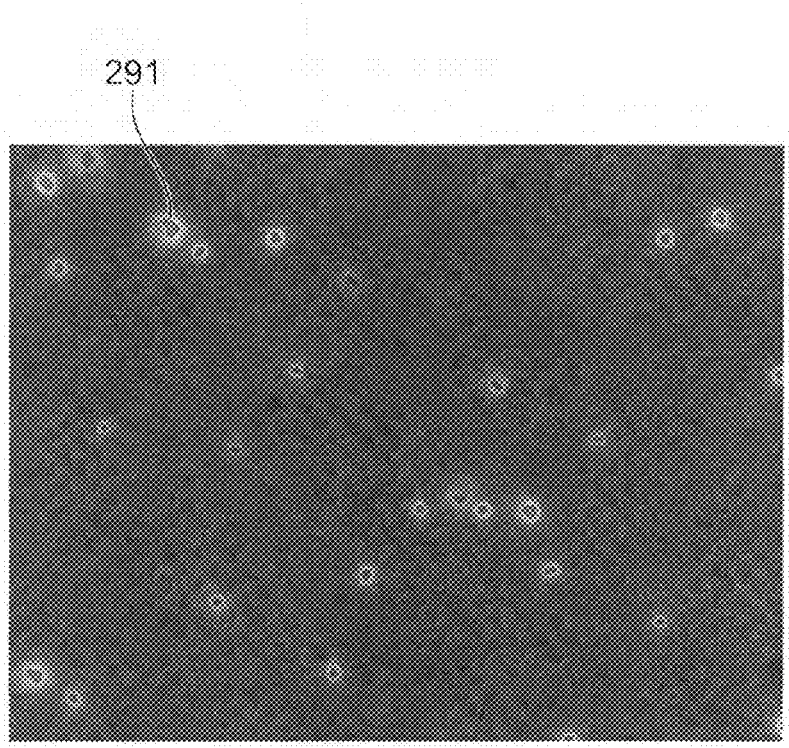
FIG. 21 is a scanning electron micrograph illustrating structure of the surface of the second electrode of the semiconductor light-emitting element of the fourth example.

FIG. 21 is a scanning electron micrograph illustrating structure of the surface of the second electrode of the semiconductor light-emitting element of the fourth example.

As shown in FIG. 21, in the semiconductor light-emitting element 31 according to the fourth example of this invention, granular images 291 having a diameter of about 0.2 μm on an average were observed. As a result of performing further analysis by a scanning electron microscope or an atomic force microscope, it was found that in the grain boundaries of the silver alloy, a void 210 like a hole passing to the p-type GaN contact layer 146 was formed. That is, the void 210 passing through the p-side electrode 150 was formed.

By the high-temperature heat treatment, the silver and platinum diffused to each other, and by the migration of the silver alloy, the void 210 was formed in the grain boundary. The area ratio of the void 210 in the plane of the p-side electrode 150 was 2.9%.

Also, in the semiconductor light-emitting element 31 according to the fourth example, by the void 210 having a width of the wavelength of the light or less provided in the p-side electrode 150, the semiconductor light-emitting element with high light taking-out efficiency can be provided.

Fourth Embodiment

Figure 22:
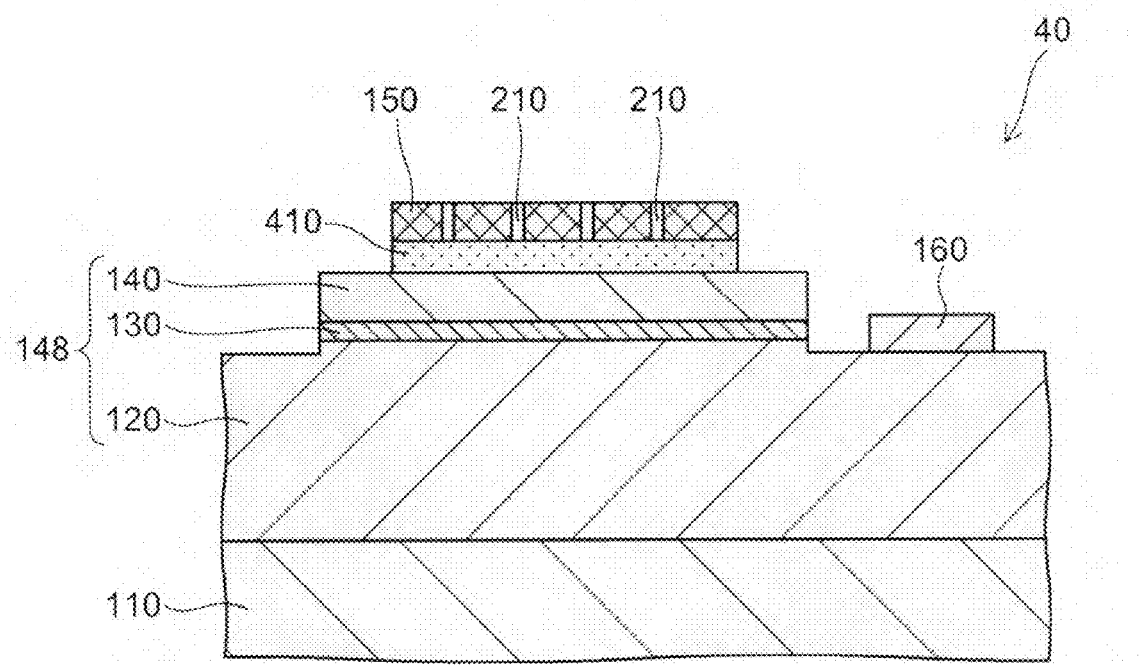
FIG. 22 is a sectional schematic view illustrating the structure of the semiconductor light-emitting element according to the fourth embodiment of this invention.

FIG. 22 is a sectional schematic view illustrating the structure of the semiconductor light-emitting element according to the fourth embodiment of this invention.

As shown in FIG. 22, the semiconductor light-emitting element 40 according to the fourth embodiment of this invention further includes a transparent electrode 410 provided between the second electrode 150 and the second semiconductor layer 140.

The structures except for this transparent electrode 410 can be the same as the semiconductor light-emitting element 30 according to the third embodiment illustrated in FIG. 13, and therefore, the explanation thereof will be explained. In the semiconductor light-emitting element 40 illustrated in FIG. 22, the second electrode 150 has the void passing through the layer of the second electrode 150. However, this invention is not limited thereto, but it is also possible that the void 210 is formed only in the interface of the second semiconductor layer 140 side of the second electrode 150 like the semiconductor light-emitting element 10 illustrated in FIGS. 1A and 1B.

For the transparent electrode 410, a substance having a larger band gap than the emission wavelength of the light-emitting layer 130 or a metal film having a sufficiently thinner film thickness than an inverse number in the emission wavelength can be used. For the transparent electrode 410, for example, nickel, ITO (Indium-tin-oxide), zinc oxide, or the like can be used.

And, the transparent electrode 410 is electrically in contact with the second semiconductor layer 140 and the second electrode 150. The transparent electrode 410 has a role of transmitting the light from the light-emitting layer 130 and reflecting the light by the second electrode 150, and therefore, it is preferable that the shape thereof in the planar view is substantially the same as the second electrode 150. The film thickness of the transparent electrode 410 is not particularly limited, and for example, can be selected from 1 nm to 500 nm.

FIGS. 23A to 23G are schematic sectional views following step sequence of the substantial part illustrating the method for producing a semiconductor light-emitting element according to the fourth example of this invention.

Figure 23A:
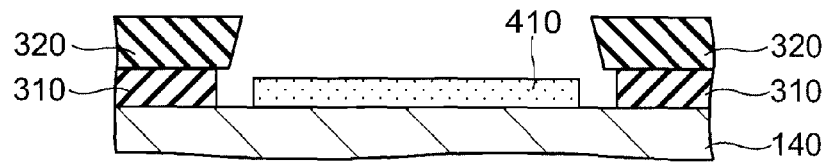
FIGS. 23A to 23G are schematic sectional views following step sequence of the substantial part illustrating the method for producing a semiconductor light-emitting element according to the fourth example.
Figure 23B:
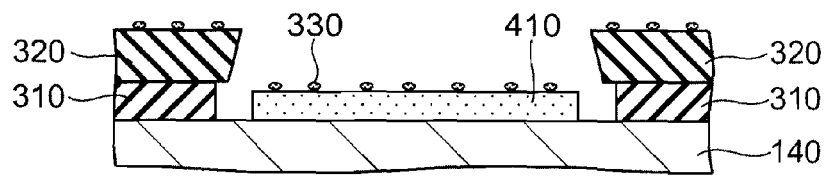
Figure 23C:
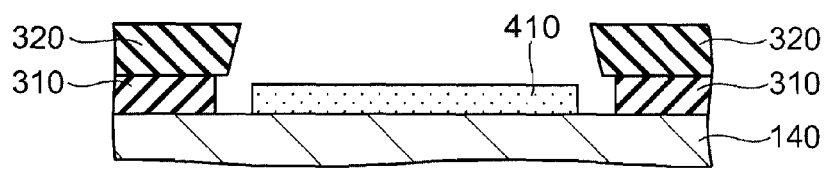
Figure 23D:
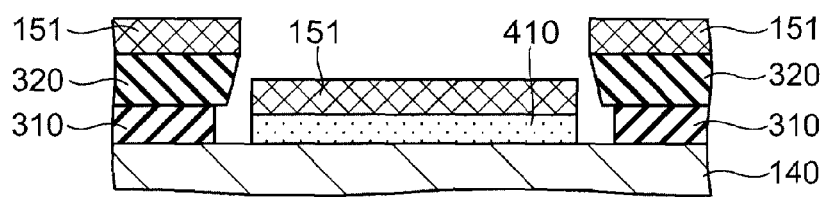
Figure 23E:
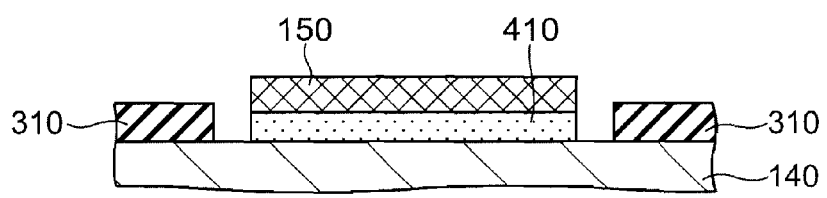
Figure 23F:
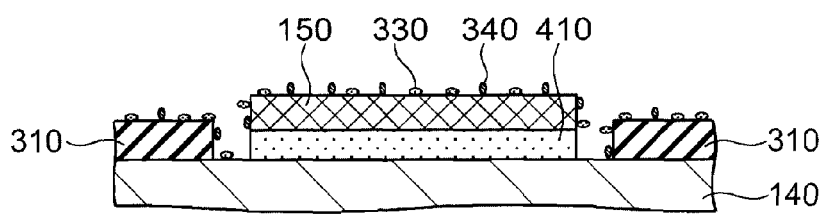
Figure 23G:
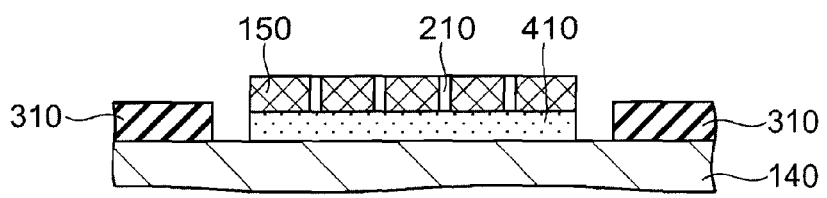

FIG. 23A is a view of a first step, and FIGS. 23B and 23G are views following the preceding views, respectively.

That is, as shown in FIG. 23A, the $SiO_2$ film 310 is provided on the semiconductor layer 148, and then for forming the p-side electrode 150, the patterned lift-off resist is formed on the semiconductor layer 148, and some of the $SiO_2$ film on the p-type GaN contact layer 146 is removed by ammonium fluoride treatment. And, in the region in which the $SiO_2$ film is removed, ITO is formed at a film thickness of 100 nm by using a vacuum deposition apparatus, and after the lift-off process, the sintering treatment is performed for one minute in a nitrogen atmosphere of 550° C., and thereby, the transparent electrode 410 is formed, and furthermore, a patterned lift-off resist 320 is formed on the semiconductor layer 148.

In this case, as shown in FIG. 23B, in the state that the moisture on the wafer is merely blown off, a little moisture remains on the wafer surface.

Then, as shown in FIG. 23C, the moisture on the wafer is sufficiently dried and removed.

And, as shown in FIG. 23D, by a vacuum deposition apparatus, on the entire wafer, the conductive film 151 to be the second electrode 150 such as an Ag monolayer is formed at a film-thickness of 200 nm.

And, as shown in FIG. 23E, the resist 320 was dissolved by an organic solvent, and thereby, only the conductive film 151 formed on the resist 320 is removed and sufficiently rinsed by ultrapure water, and then, the wafer is sufficiently dried on a hot plate at 120° C. Thereby, the p-side electrode 150 is formed in the region in which the $SiO_2$ film 310 is removed.

And, as shown in FIG. 23F, the wafer is kept in a clean room in which the temperature and the humidity are controlled to be 25° C.±1° C. and 50%±1% respectively for 24 hours, and thereby, a little moisture 330 and/or ionized substance 340 is attached to the surface of the formed p-side electrode 150.

And, as shown in FIG. 23G, by using an RTA apparatus, the heat treatment is performed for 1 minute in an nitrogen atmosphere of a temperature of 550° C., and the temperature was lowered at 5° C./second to the normal temperature, and thereby, the void 210 is formed in the interface between the p-type GaN contact layer 146 and the p-side electrode 150.

And, similarly as explained previously, the first electrode 160 is formed, and thereby, the semiconductor light-emitting element 40 according to this embodiment can be formed.

Also, in the semiconductor light-emitting element 40 of this embodiment further having the transparent 410 between the second electrode 150 and the second semiconductor layer 140 produced as described above, the semiconductor light-emitting element with high light taking-out efficiency can be provided by the void 210 having an width of the wavelength of the light or less provided in the second electrode 150.

The width of the void 210 and the density and the area ratio in the plane of the p-side electrode 150 can be changed by the heat treatment temperature and/or by type, film thickness, and multilayer structure of the metal material to be heat-treated at the same time as the conductive film 151. However, these conditions that are optimized for improving the optical output do not necessarily have the optimum combination with the electrical characteristic. In this case, when the transparent electrode 410 is provided between the second electrode 150 and the second semiconductor layer 140 and the second electrode 150 functioning as a high efficient reflective film is provided through the transparent electrode 410 like the semiconductor light-emitting element 40 according to this embodiment, the optimized conditions for forming the void 210 with heavily weighting the optical-output improvement characteristic can be adopted, and thereby, the semiconductor light-emitting element with high light taking-out efficiency that can be more easily produced and that has higher performance can be provided.

Fifth Embodiment

Figure 24A:
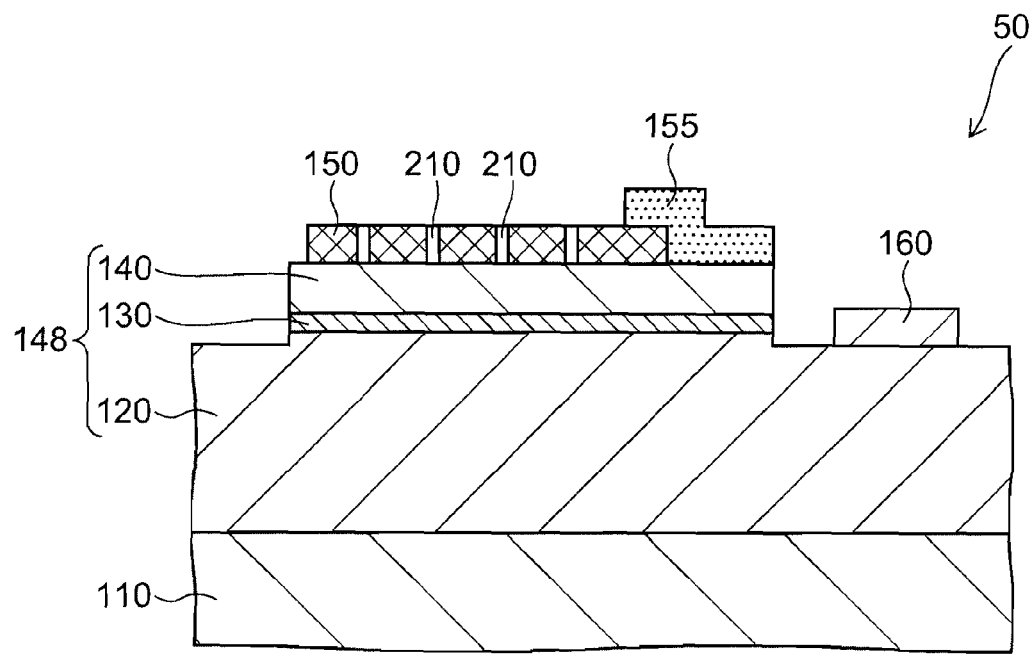
FIGS. 24A and 24B are schematic views illustrating a structure of the semiconductor light-emitting element according to the fifth embodiment of this invention.
Figure 24B:
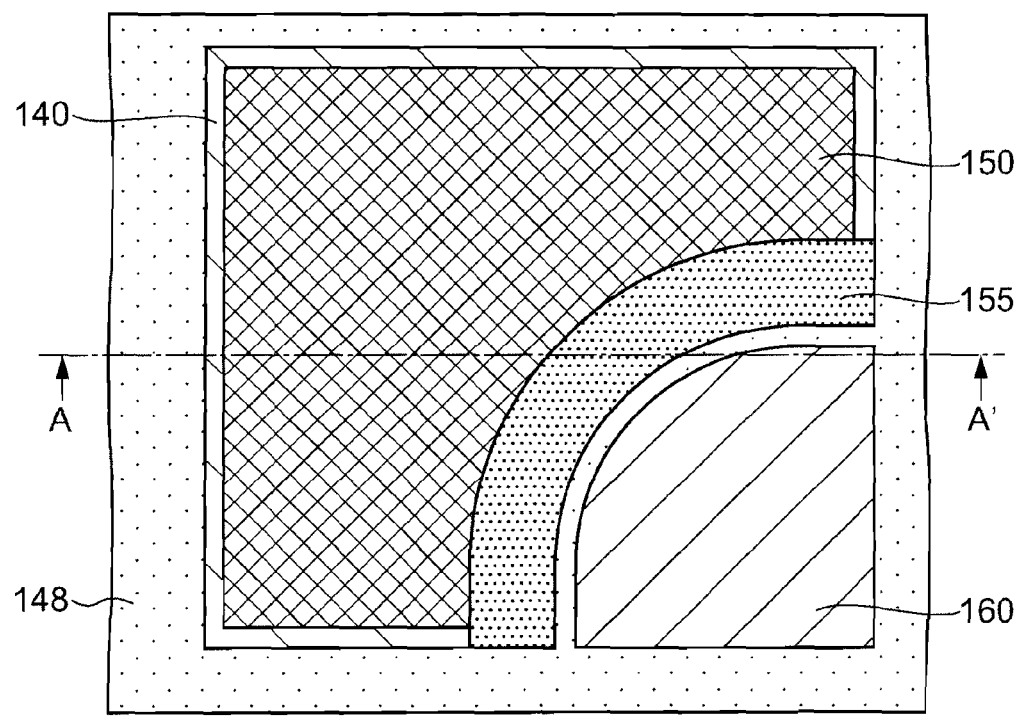

FIGS. 24A and 24B are schematic views illustrating a structure of the semiconductor light-emitting element according to the fifth embodiment of this invention.

That is, FIG. 24B is a plan schematic view illustrating the structure of the semiconductor light-emitting element according to the fifth embodiment of this invention, and the FIG. 24A is a sectional schematic view of the A-A' line.

As shown in FIGS. 24A and 24B, the semiconductor light-emitting element 50 according to the fifth embodiment of this invention has the above-described second electrode 150 having the void 210 and a third electrode 155, on the second semiconductor layer 140. And, the third electrode 155 is electrically in contact with the second electrode 150.

Moreover, the third electrode 155 can have a better ohmic property than the ohmic property of the second electrode 150.

The position for providing the third electrode 155 is optional as long as being on the second semiconductor layer 140. However, as illustrated in FIGS. 24A and 24B, when the third electrode 155 is provided in contact with the first electrode 160 side of the second electrode 150, the conductive part having high ohmic property can be disposed in the region opposed to the first electrode 160, and therefore, stable electric characteristic can be obtained.

The structure except for the third electrode 155 can be the same as the semiconductor light-emitting element 30 according to the third embodiment illustrated in FIG. 13, and therefore, the explanation thereof will be omitted. In the semiconductor light-emitting element 50 illustrated in FIGS. 24A and 24B, the second electrode 150 has the void 210 passing through the layer of the second electrode 150. However, this invention is not limited thereto, but it is also possible that the void 210 is formed only in the interface of the second semiconductor layer 140 side of the second electrode 150 like the semiconductor light-emitting element 10 illustrated in FIGS. 1A and 1B.

The semiconductor light-emitting element 50 according to this embodiment can be produced as follows.

That is, similarly to the method for producing the semiconductor light-emitting element 30 illustrated in FIGS. 23A to 23G previously, the second electrode 150 (for example, Ag monolayer film having a film thickness of 200 nm) with a predetermined pattern having the void 210 is formed, and then, for example, an Ag/Pt film for forming the third electrode 155 is formed in a predetermined pattern at a film thickness of 200 nm, and by using an RTA apparatus, the heat treatment for 1 minute in an nitrogen atmosphere of 350, which is one of the conditions of not generating the void, is performed. Thereby, the void is not generated in the third electrode 155, and the ohmic property thereof can be higher than that of the second electrode.

And, similarly as explained previously, the first electrode 160 is formed, and thereby, the semiconductor light-emitting element 50 illustrated in FIGS. 24 and 24B can be obtained.

The width of the void 210 and the density and the area ratio in the plane of the p-side electrode 150 can be changed by the heat treatment temperature and/or by type, film thickness, and multilayer structure of the metal material to be heat-treated at the same time as the conductive film 151. However, these conditions that are optimized for improving the optical output do not necessarily have the optimum combination with the electrical characteristic.

Moreover, in the case of the electrode structure for carrying the current in the lateral direction (the direction parallel to each of the layers) like the above-described semiconductor light-emitting element of this embodiment, the current has a tendency of concentrating on the side of the second electrode 150 opposed to the first electrode 160. In particular, the effect appears more significantly as the current density is more enhanced.

In this case, when the third electrode 155 that is electrically in contact with the side of the second electrode 150 opposed to the first electrode 160 and that has a better ohmic characteristic than that of the second electrode 150 and that has a high efficient light-reflective characteristic is provided like the semiconductor light-emitting element 50 of this embodiment, both of the light taking-out efficiency and the electrical characteristic can be highly satisfied. That is, various conditions for the second electrode 150 can be optimized by focusing attention on improving the light taking-out efficiency, and the various conditions for the third electrode 155 can be optimized by focusing attention on improving the electrical characteristic.

That is, by providing the third electrode with good ohmic property like the semiconductor light-emitting element 50 of this invention, the semiconductor light-emitting element with good electrical characteristic and high light taking-out efficiency can be provided.

As the area of the third electrode 155 in the planar view is more enlarged, the electrical characteristics are more improved, but the enlargement to an extent leads to saturation of the improvement. On the other hand, for improving the light taking-out efficiency, the effect thereof is higher as the area of the second electrode 150 is larger. Considering these effects, by adapting the second electrode 150 and the first electrode 160 to the design, the area of the third electrode 155 can be appropriately determined.

The semiconductor light-emitting element 50 illustrated in FIGS. 24A and 24B has a structure in which the second electrode 150 is first formed and the third electrode 155 is provided so as to cover some of the second electrode 150. However, it is also possible to adopt a structure in which the third electrode 155 is first formed and the second electrode 150 is provided so as to cover some of the third electrode 155. In this case, the temperature of the high-temperature heat treatment of the third electrode 155 can be set to be higher than the temperature of the high-temperature heat treatment of the second electrode 150.

Also, in the semiconductor light-emitting element 50 according to this embodiment, the transparent electrode may be provided at least in a part between the second semiconductor layer 140 and at least any one of the second electrode 150 and the third electrode 155.

Sixth Embodiment

Figure 25:
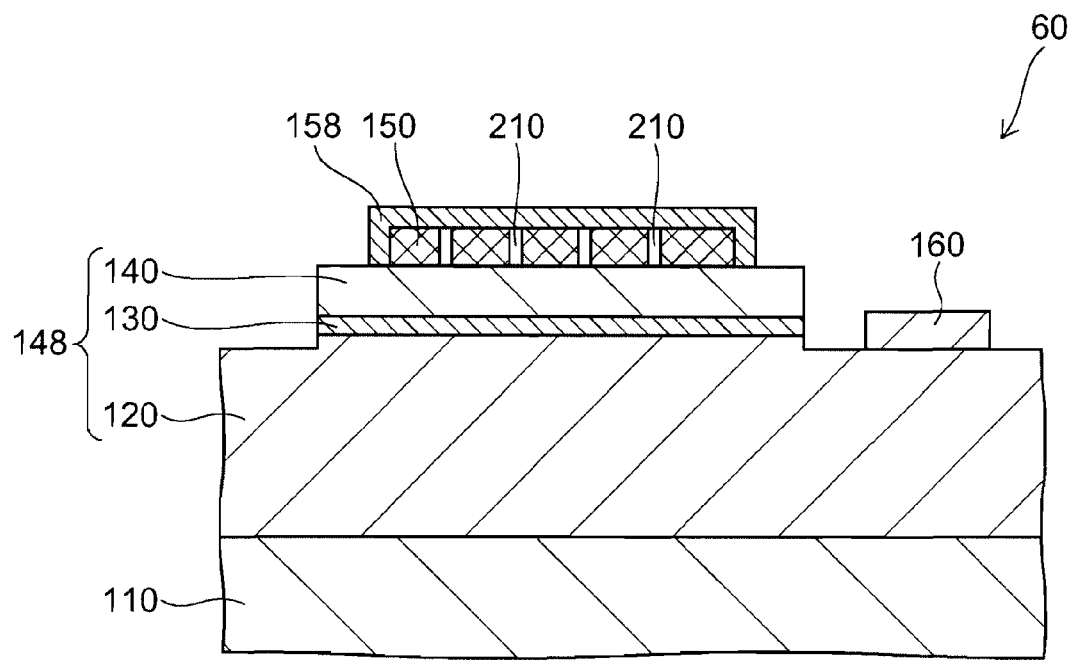
FIG. 25 is a sectional schematic view illustrating a structure of the semiconductor light-emitting element according to a sixth embodiment of this invention.

FIG. 25 is a sectional schematic view illustrating a structure of the semiconductor light-emitting element according to a sixth embodiment of this invention.

As shown in FIG. 25, in the semiconductor light-emitting element 60 according to the sixth embodiment of this invention, a pad 158 is provided in the surface of the second electrode 150 opposite to the second semiconductor layer 140.

The structure except for the pad 158 is the same as the semiconductor light-emitting element 30 according to the third embodiment illustrated in FIG. 13, and the explanation thereof will be omitted. In the semiconductor light-emitting element 60 illustrated in FIG. 25, the second electrode 150 has the void 210 passing through the layer of the second electrode 150. However, this invention is not limited thereto, but it is also possible that the void 210 is formed only in the interface of the second semiconductor layer 140 side of the second electrode 150 like the semiconductor light-emitting element 10 illustrated in FIGS. 1A and 1B.

After forming the second electrode 150 having the void 210, the pad 158 can be formed by, for example, forming Pt/Au at a film thickness of 800 nm so as to cover a part on the second electrode 150 or to cover the entire part containing the side surface of the second electrode 150 and then patterning the Pt/Au in a predetermined shape. For the patterning, for example, the lift-off method can be used.

For the second electrode 150 side of the pad 158, it is preferable to use high-melting-point material such as not diffusing to the second electrode 150. The high-melting-point material include, for example, vanadium (V), chromium (Cr), iron (Fe), cobalt (Co), nickel (Ni), niobium (Ni), molybdenum (Mo), ruthenium (Ru), rhodium (Rh), tantalum (Ta), tungsten (W), rhenium (Re), osmium (Os), iridium (Ir), and platinum (Pt). Rhodium (Rh) or platinum (Pt) is particularly preferable, and has the reflective ratio with respect to the visible light that is high to some extent, and therefore, also functions as the reflective film.

By providing the pad 158 like the semiconductor light-emitting element 60 according to this embodiment, the bondability of the wire bonding can be improved, and the die shear strength in formation of gold bump with a ball bonder can be improved, and furthermore, this can be applied to the flip-chip mount. Furthermore, by the pad 158, the second electrode 150 is separated from the outside air, and degradation of the silver or the silver alloy can be suppressed, and the reliability thereof is improved. Furthermore, the improvement of the heat release property of the semiconductor light-emitting element 60 can be expected. This pad 158 can also be used as gold (Au) bump. Also, instead of Au, an AuSn bump can be formed.

That is, by providing the pad 158 like the semiconductor light-emitting element 60 according to this embodiment, the semiconductor light-emitting element with high light taking-out efficiency that can be easily produced and that has high reliability and that has good heat release property can be provided.

Also, in the semiconductor light-emitting element 60 according to this embodiment, the above-described third electrode 155 in contact with the second electrode 150 may be provided, and the transparent electrode may be provided at least in a part between the second semiconductor layer 140 and at least any one of the second electrode 150 and the third electrode 155.

Figure 26:
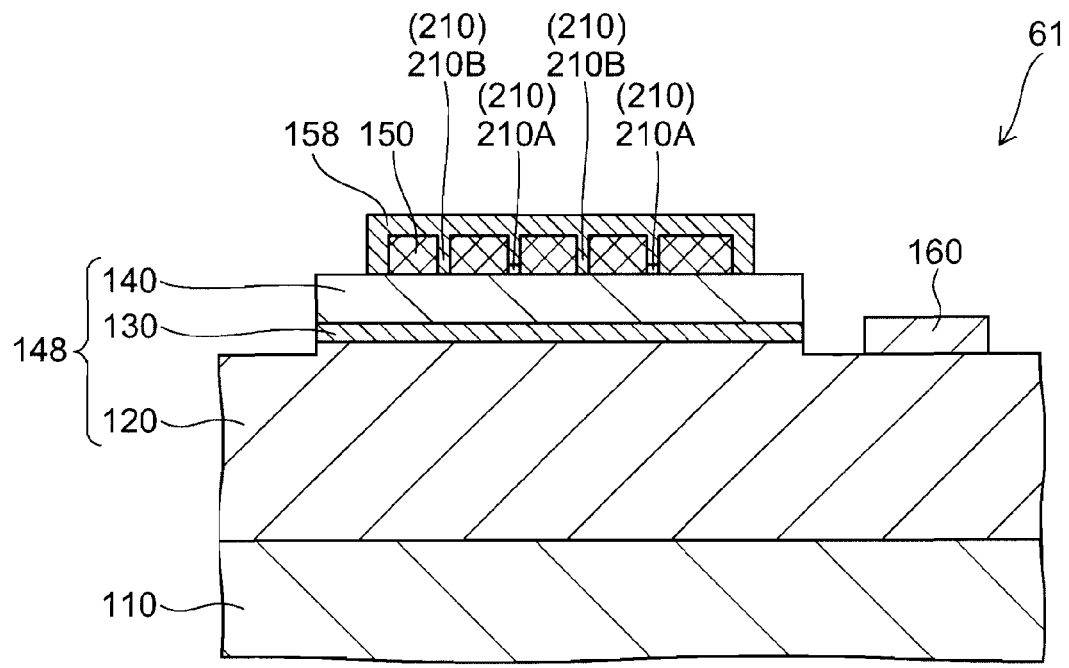
FIG. 26 is a sectional schematic view illustrating another structure of the semiconductor light-emitting element according to a sixth embodiment of this invention.

FIG. 26 is a sectional schematic view illustrating another structure of the semiconductor light-emitting element according to a sixth embodiment of this invention.

As shown in FIG. 26, in another semiconductor light-emitting element 61 according to the sixth embodiment of this invention, a pad 158 is provided in the surface of the second electrode 150 opposite to the second semiconductor layer 140. And, some of the void 210 of the second electrode 150 is buried with the conductive material to be the pad 158.

That is, the semiconductor light-emitting element 61 illustrated in FIG. 26 has, for example, a structure in which the second electrode 150 has the void 210 passing through the layer of the second electrode 150 on the way of the production and some of the void 210 is buried by the subsequent formation of the pad 158.

The structure except for the void 210 is the same as the semiconductor light-emitting element 60 illustrated in FIG. 25, and therefore, the explanation thereof will be omitted.

And, as shown in FIG. 26, in the semiconductor light-emitting element 61, a part 210A out of the void 210 is buried by the pad 158 but the space remains in the interface of the second semiconductor layer 140. On the other hand, in another part 210B of the void 210, the entirety of the void is buried with the material to be the pad 158.

In the part 210A of the void in which the space remains in the interface of the semiconductor layer 140, the light taking-out efficiency is improved by the same effect as explained previously.

And, in the part 210B of the void in which the entirety of the void 210 is buried, the light taking-out efficiency is improved by the following effect.

That is, by using the different conductive materials between the second electrode 150 and the pad 158, the difference of the complex refractive index between the both can be generated, and thereby, the diffuse reflection is generated, and the light taking-out efficiency can be improved.

The wavelength in a medium is a value of the wavelength in a free space of the emitted light divided by the refractive index of the medium and becomes shorter than the wavelength in a free space. For example, in the case of the semiconductor light-emitting element 61 according to this embodiment, when the refractive index of the layer (p-type GaN contact layer 146) of the second electrode 150 side of the second semiconductor layer 140 is 2.47 with respect to the emission wavelength of 380 nm, the wavelength in the medium becomes about 150 nm. Therefore, in the case of burying the void region with another metal (the conductive film to be the pad 158) like the semiconductor light-emitting element 61, for generating effective diffuse reflection, it is desirable that the width of the void 210 is set to be the same length or less as the wavelength in the medium.

In the case of the structure in which the void 210 is provided only in the interface side of the second electrode 150 to the second semiconductor layer 140 and the void 210 is passivated by the conductive film of the second electrode 150 like the semiconductor light-emitting element 10 illustrated in FIGS. 1A and 1B, the refractive index in the void 210 is about 1 without changing before and after the formation of the pad 158, and therefore, it is sufficient that the width of the void 210 is almost the same length or less as the wavelength in a free space.

As described above, also in the case that some of the void 210 is buried with a different conductive material (metal) from the second electrode 150, the diffuse reflection can be generated, and the semiconductor light-emitting element with high light taking-out efficiency can be provided.

Also in another semiconductor light-emitting element 61 of this embodiment, the above-described third electrode 155 in contact with the second electrode 150 may be provided, and the transparent electrode may be provided at least in a part between the second semiconductor layer 140 and at least any one of the second electrode 150 and the third electrode 155.

Seventh Embodiment

Next, a seventh embodiment will be explained. The semiconductor light-emitting element according to this embodiment is a semiconductor light-emitting element in which the above-described semiconductor light-emitting element of each of the embodiments and each of the examples and a fluorescent material are combined.

Figure 27:
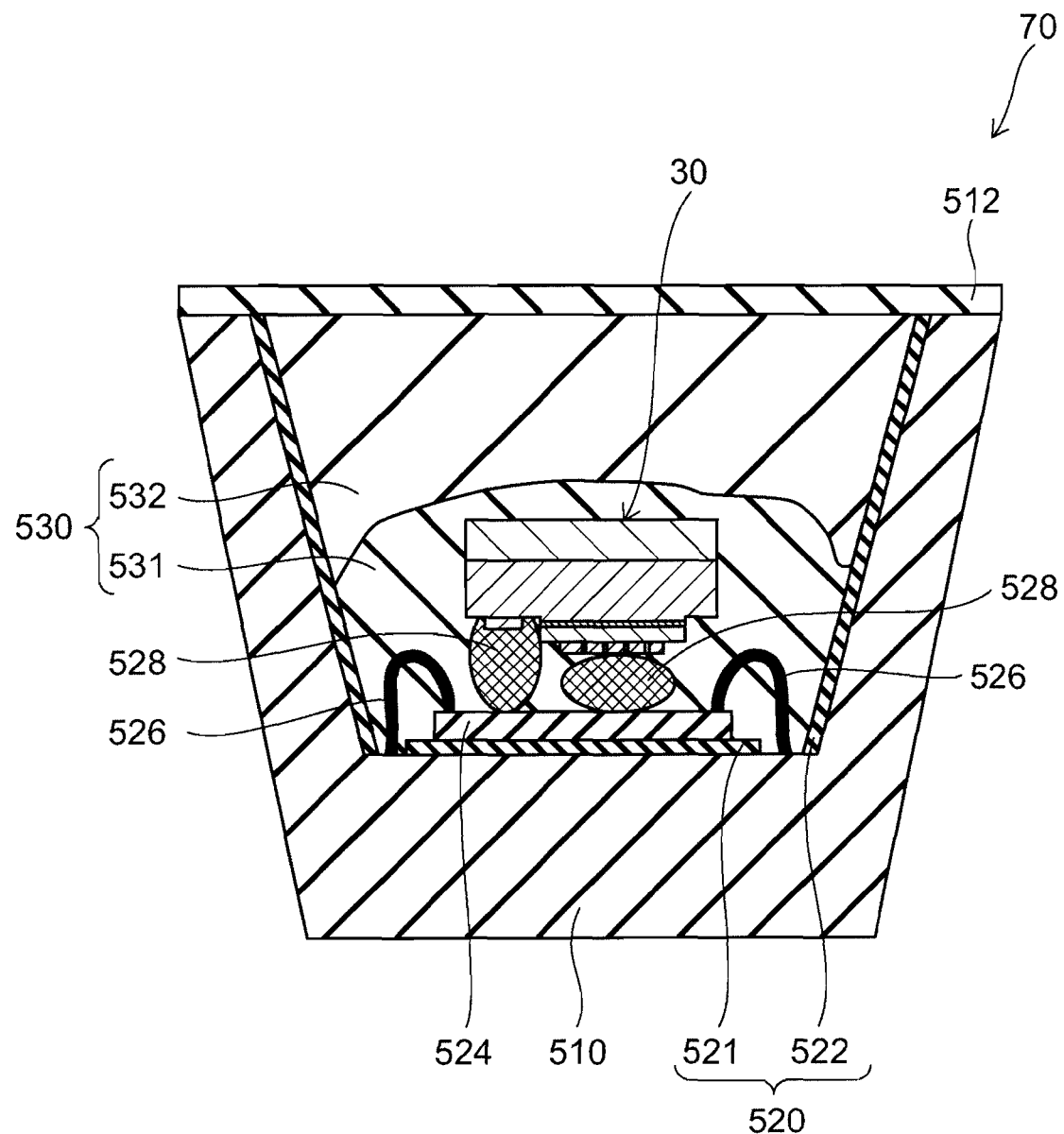
FIG. 27 is a sectional schematic view illustrating a structure of the semiconductor light-emitting element according to the seventh embodiment of this invention.

FIG. 27 is a sectional schematic view illustrating a structure of the semiconductor light-emitting element according to the seventh embodiment of this invention.

As shown in FIG. 27, the semiconductor light-emitting element 70 according to the seventh embodiment of this invention includes, for example, the semiconductor light-emitting element 30 of the third embodiment and a fluorescent material layer 530 that can be excited by the light emitted in the semiconductor light-emitting element 30 to emit a fluorescent light.

That is, as shown in FIG. 27, a reflective film 520 is provided in the inner surface of the container 510 made of ceramics or the like. The reflective film 520 is provided so as to be divided into the reflective film 521 on the bottom surface of the container 510 and the reflective film 522 on the side surface of the container 510. For the reflective film 520, for example, aluminum or the like can be used.

And, on the reflective film 521 of the bottom surface of the container 510, the semiconductor light-emitting element 30 is disposed through a submount 524. On the semiconductor light-emitting element 30, a gold bump 528 is formed by a ball bonder, and the semiconductor light-emitting element 30 is fixed to the submount 524. It is also possible that without using the gold bump 528, the semiconductor light-emitting element 30 is fixed to the submount 524.

For example, adhesion by an adhesive agent or solder or the like can be used for the fixation of the semiconductor light-emitting element 30, the submount 524, and the reflection film 520.

On the surface of the semiconductor light-emitting element 30 side of the submount 524, patterned electrodes are formed so as to be insulated with respect to the second electrode (p-side electrode) 150 and the first electrode (n-side electrode) 160 of the semiconductor light-emitting element 30, and the respective patterned electrodes are connected to the electrodes (not shown in figure) provided in the container 510 side, with the bonding wires 526. The connections are performed in parts between the reflective film 522 of the side surface and the reflective film 521 of the bottom surface.

And, the fluorescent material layer 530 is provided so as to cover the semiconductor light-emitting element 30 and the bonding wires 526. In the semiconductor light-emitting element 70 illustrated in FIG. 27, as the fluorescent material layer 530, a first fluorescent material layer 531 containing a red fluorescent material and a second fluorescent material layer 532 provided on the first fluorescent material layer 531 and containing a blue, green or yellow fluorescent material are provided. On these fluorescent material layers 530, for example, a lid 512 made of silicon resin is provided.

The first fluorescent material layer 531 includes a resin and a red fluorescent material dispersed in the resin. For the red fluorescent material, for example, $Y_2O_3$, $YVO_4$, $Y_2(P,V)O_4$ or the like can be used as the base material, and trivalent Eu ($Eu^{3+}$) is contained therein as the activation substance. That is, $Y_2O_3:Eu^{3+}$, $YVO_4:Eu^{3+}$, or the like can be used as the red fluorescent material. The concentration of $Eu^{3+}$ can be 1% to 10% by molar concentration. As the base material of the red fluorescent material, as well as $Y_2O_3$ or $YVO_4$, LaOS or $Y_2(P,V)O_4$ or the like can be used. Moreover, as well as $Eu^{3+}$, $Mn^{4+}$, or the like can be utilized. In particular, by adding a small amount of Bi with the trivalent Eu to the base material of $YVO_4$, the absorption of 380 nm increases, and therefore, the light-emitting efficiency can be enhanced. Moreover, as the resin, for example, silicon resin or the like can be used.

Moreover, the second fluorescent material layer 532 includes a resin and a fluorescent material that is at least any one of blue, green, and yellow and that is dispersed in the resin. For example, the fluorescent material in which the blue fluorescent material and the green fluorescent material are combined may be used, or the fluorescent material in which the blue fluorescent material and the yellow fluorescent material are combined may be used, or the fluorescent material in which the blue fluorescent material, the green fluorescent material, and the yellow fluorescent material are combined may be used.

For the blue fluorescent material, for example, $(Sr,Ca)_{10}(PO_4)_6Ci_2:Eu^{2+}$ or $BaMg_2Al_{16}O_{27}:Eu^{2+}$ or the like can be used.

For the green fluorescent material, for example, $Y_2SiO_5:Ce^{3+},Tb^{3+}$ in which the trivalent Tb is the emission center can be used. In this case, because the energy is transfer from Ce ion to Tb ion, the excitation efficiency is improved. For the green fluorescent material, for example, $Sr_4Al_{14}O_{25}:Eu^{2+}$ or the like can be used.

For the yellow fluorescent material, for example, $Y_3Al_5:Ce^{3+}$ or the like can be used.

Moreover, for the resin, for example, silicon resin or the like can be used.

In particular, the trivalent Tb indicates sharp emission in the vicinity of 550 nm, in which the visibility becomes the maximum, and therefore, when the trivalent Tb is combined with the sharp red emission of Eu, the emission efficiency is significantly improved.

By the semiconductor light-emitting element 70 according to this embodiment, the ultraviolet light of 380 nm generated from the semiconductor light-emitting element 30 is emitted to the substrate side of the semiconductor light-emitting element 30, and the reflection in the reflective films 521, 522 is also utilized, and thereby, the above-described fluorescent materials contained in the respective fluorescent material layers can be efficiently excited.

For example, in the above-described fluorescent material having the emission center of the trivalent Eu or the like contained in the first fluorescent material layer 531, the light is converted into a light having the wavelength distribution of the vicinity of 620 nm, and thereby the red visible light can be efficiently obtained.

Moreover, the blue, green, or yellow fluorescent material contained in the second fluorescent material layer 532 is efficiently excited, and thereby, the blue, green, or yellow visible light can be efficiently obtained.

As the mixed colors thereof, a white light and lights with the other various colors can be obtained with high efficiency and good color rendering properties.

In the above description, the example in which the semiconductor light-emitting element 30 according to the third embodiment is used has been presented, but this invention is not limited thereto, and the above-described semiconductor light-emitting elements 10, 11, 40, 50, 60, and 61 according to the embodiments and the examples can be used.

Next, the method for producing the semiconductor light-emitting element according to this embodiment will be explained.

The steps for producing the semiconductor light-emitting element 30 are the same as explained previously.

And, first, the metal film to be the reflective film, is formed on the inner surface of the container 510 by, for example, a sputtering method, and the metal film is patterned to form the reflective films 521, 522 in the bottom surface and the side surface of the container 510, respectively.

And, on the semiconductor light-emitting element 30, the gold bumps 528 are formed by a ball bonder. And, on the submount 524 having the electrodes patterned for the second electrode (p-side electrode) 150 and the first electrode (n-side electrode) 160 of the semiconductor light-emitting element 30, the semiconductor light-emitting element 30 is fixed, and the submount 524 is disposed and fixed onto the reflective film 521 of the bottom surface of the container 510. For the fixation, adhesion by an adhesive agent or solder or the like can be used. Moreover, it is also possible that without using the gold bump 528 by the ball bonder, the semiconductor light-emitting element 30 is directly fixed onto the submount 524.

Next, the first electrode 160 and the second electrode 150 (not shown) on the submount 524 are connected to the electrodes (not shown) provided in the container 510 side, respectively, with bonding wires 526. Furthermore, the first fluorescent material layer 531 is formed so as to cover the semiconductor light-emitting element 30 or the bonding wires 526, and the second fluorescent material layer 532 is formed on the first fluorescent material layer 531. For the respective methods for forming the fluorescent material layers, for example, a method of dropping each of the fluorescent materials dispersed in the resin material mixtures and then performing thermal polymerization by heat treatment to harden the resin can be used. When the resin material mixture containing each of the fluorescent materials is dropped and then left to stand for a while and then hardened, the fine particles of each of the fluorescent materials are precipitated and the fine particles can be localized to the lower part of each of the layers of the first fluorescent material layer 531 and the second fluorescent material layer 532, and thereby, the emission efficiency of each of the fluorescent materials can be appropriately controlled. Then, the lid 512 is provided on the fluorescent material layer, and thereby, the semiconductor light-emitting element 70 according to this embodiment, namely, white LED is produced. As described above, by the produced semiconductor light-emitting element 70 of this embodiment, the semiconductor light-emitting element with high light taking-out efficiency that can generate various colors with high efficiency can be provided.

In each of the above-described embodiments, the example in which the first semiconductor layer 120 is an n-type semiconductor layer and the second semiconductor layer 140 is a p-type semiconductor layer has been presented. However, this invention is not limited thereto, and the conductivity types can be inverted.

As described above, the embodiments of this invention has been explained with reference to the specific examples. However, this invention is not limited to these specific examples. For example, the specific structures of each of the components composing the semiconductor light-emitting element and the method for producing the same, such as shape, size, material, arrangement relation, and crystal growth process of each of the components such as the semiconductor multilayer film, the metal film, and the dielectric film, are included in the scope of this invention as long as the invention can be similarly carried out by performing appropriate selection from the known range by those skilled in the art and the same effect can be obtained.

Moreover, combinations of two or more components of each of the specific examples in the technically possible range are included in the scope of this invention as long as including the spirit of this invention.

In addition, all of the semiconductor light-emitting elements and the methods for producing the same which can be carried out with appropriately design-modified by those skilled in the art based on the semiconductor light-emitting element and the method for producing the same that have been described as the embodiments of this invention also belong to the scope of this invention as long as including the spirit of this invention.

In addition, it is understood that in the range of the idea of this invention, various modified examples and changed examples can be achieved by those skilled in the art and that the modified examples and the changed examples also belong to the scope of this invention.

In this specification, "nitride semiconductor" includes all of the semiconductors having the compositions in which the composition ratios x, y, and z are changed in the respective ranges in the chemical formula of $B_xIn_yAl_zGa_{1-x-y-z}N$ ($0 \leq x \leq 1$, $0 \leq y \leq 1$, $0 \leq z \leq 1$, $x+y+z \leq 1$). Furthermore, in the above-described chemical formula, the semiconductor further containing a group V element except for N (nitrogen) or the semiconductor further containing any one of various dopants to be added for controlling the conductivity type and so forth is also included in the "nitride semiconductor".

The invention claimed is:

1. A semiconductor light-emitting element comprising:
   a first semiconductor layer;
   a second semiconductor layer;
   a light-emitting layer provided between the first semiconductor layer and the second semiconductor layer;
   a first electrode connected to the first semiconductor layer; and
   a second electrode provided on the second semiconductor layer,
   wherein a side of the second electrode facing to the second semiconductor layer is composed of at least any one of silver and silver alloy,
   wherein the second electrode has a void having a width of emission wavelength or less of the light-emitting layer in a plane of the second electrode facing to the second semiconductor layer, and
   wherein the void is provided in an interface of the second electrode to the second semiconductor layer and provided so as to pass through the thickness direction of the second electrode.

2. The element according to claim 1, wherein the void is formed by migration according to high-temperature heat treatment of silver contained in the second electrode.

3. The element according to claim 1, wherein the first semiconductor layer, the second semiconductor layer and the light-emitting layer are formed on a sapphire substrate.

4. The element according to claim 1, wherein the first semiconductor layer, the second semiconductor layer and the light-emitting layer are made of $Al_xGa_{1-x-y}In_yN$ ($x \geq 0$, $y \geq 0$, $x+y \leq 1$).

5. The element according to claim 1, wherein the first semiconductor layer has n-type conductivity and the second semiconductor layer has p-type conductivity.

6. The element according to claim 1, wherein the second electrode is a silver monolayer film.

7. The element according to claim 1, further comprising a third electrode, the third electrode:
   being provided on the second semiconductor layer,
   being in contact with the second electrode, and
   having a higher ohmic property than an ohmic property of the second electrode with respect to the second semiconductor layer.

8. The element according to claim 1, further comprising a fluorescent material having an emission center of trivalent Eu and excited by a light with the emission wavelength to emit a red light, the first semiconductor layer, the second semiconductor layer and the light-emitting layer being made of semiconductor nitride, the emission wavelength of the light-emitting layer being 370 nm to 400 nm.

9. The element according to claim 1, further comprising a transparent conductive film being provided between the second semiconductor layer and the second electrode and transmitting a light from the light-emitting layer.

10. The element according to claim 9, wherein the transparent conductive film is made of a material having a larger band gap than an energy of photon at an emission wavelength of the light-emitting layer.

11. The element according to claim 9, wherein a film thickness of the transparent conductive film is thinner than an inverse number of an absorption coefficient in an emission wavelength of the light-emitting layer.

12. The element according to claim 9, wherein the transparent conductive film contains at least one of nickel, indium tin oxide, and zinc oxide.

13. The element according to claim 1, wherein the first semiconductor layer, the second semiconductor layer and the light-emitting layer are formed on a sapphire substrate via a single crystal aluminum nitride layer.

14. The element according to claim 13, wherein in the sapphire substrate side of the single crystal aluminum nitride layer, a region having a higher carbon concentration than that of the inside of the single crystal aluminum nitride layer is provided.

15. A semiconductor light-emitting element comprising:
    a first semiconductor layer;
    a second semiconductor layer;
    a light-emitting layer provided between the first semiconductor layer and the second semiconductor layer;
    a first electrode connected to the first semiconductor layer; and
    a second electrode provided on the second semiconductor layer,
    wherein a side of the second electrode facing to the second semiconductor layer is composed of at least any one of silver and silver alloy,
    wherein the second electrode has a void having a width of emission wavelength or less of the light-emitting layer in a plane of the second electrode facing to the second semiconductor layer, and
    wherein the void is provided in an interface of the second electrode to the second semiconductor layer and in an interface of the second electrode opposite to the second semiconductor layer.

16. A semiconductor light-emitting element comprising:
a first semiconductor layer;
a second semiconductor layer;
a light-emitting layer provided between the first semiconductor layer and the second semiconductor layer;
a first electrode connected to the first semiconductor layer; and
a second electrode provided on the second semiconductor layer,
wherein a side of the second electrode facing to the second semiconductor layer is composed of at least any one of silver and silver alloy,
wherein the second electrode has a void having a width of emission wavelength or less of the light-emitting layer in a plane of the second electrode facing to the second semiconductor layer, and
wherein the void is provided in the interface of the second electrode to the second semiconductor layer and in a layer of the second electrode.

17. A semiconductor light-emitting element comprising:
a first semiconductor layer;
a second semiconductor layer;
a light-emitting layer provided between the first semiconductor layer and the second semiconductor layer;
a first electrode connected to the first semiconductor layer; and
a second electrode provided on the second semiconductor layer,
wherein a side of the second electrode facing to the second semiconductor layer is composed of at least any one of silver and silver alloy,
wherein the second electrode has a void having a width of emission wavelength or less of the light-emitting layer in a plane of the second electrode facing to the second semiconductor layer, and
wherein the second electrode is a silver monolayer film.

18. A semiconductor light-emitting element comprising:
a first semiconductor layer;
a second semiconductor layer;
a light-emitting layer provided between the first semiconductor layer and the second semiconductor layer;
a first electrode connected to the first semiconductor layer;
a second electrode provided on the second semiconductor layer; and
a third electrode being provided on a second semiconductor layer, being in contact with the second electrode and having a higher ohmic property than an ohmic property of the second electrode with respect to the second semiconductor layer,
wherein a side of the second electrode facing to the second semiconductor layer is composed of at least any one of silver and silver alloy, and
wherein the second electrode has a void having a width of emission wavelength or less of the light-emitting layer in a plane of the second electrode facing to the second semiconductor layer.

19. A semiconductor light-emitting element comprising:
a first semiconductor layer;
a second semiconductor layer;
a light-emitting layer provided between the first semiconductor layer and the second semiconductor layer;
a first electrode connected to the first semiconductor layer; and
a second electrode provided on the second semiconductor layer,
wherein a side of the second electrode facing to the second semiconductor layer is composed of at least any one of silver and silver alloy,
wherein the second electrode has a void having a width of emission wavelength or less of the light-emitting layer in a plane of the second electrode facing to the second semiconductor layer,
wherein the first semiconductor layer, the second semiconductor layer and the light-emitting layer are formed on a sapphire substrate via a single crystal aluminum nitride layer, and
wherein in the sapphire substrate side of the single crystal aluminum nitride layer, a region having a higher carbon concentration than that of the inside of the single crystal aluminum nitride layer is provided.

20. A semiconductor light-emitting element comprising:
a first semiconductor layer;
a second semiconductor layer;
a light-emitting layer provided between the first semiconductor layer and the second semiconductor layer;
a first electrode connected to the first semiconductor layer;
a second electrode provided on the second semiconductor layer; and
a fluorescent material having an emission center of trivalent Eu and excited by a light with the emission wavelength to emit a red light, the first semiconductor layer, the second semiconductor layer and the light-emitting layer being made of semiconductor nitride, the emission wavelength of the light-emitting layer being 370 nm to 400 nm,
wherein a side of the second electrode facing to the second semiconductor layer is composed of at least any one of silver and silver alloy, and
wherein the second electrode has a void having a width of emission wavelength or less of the light-emitting layer in a plane of the second electrode facing to the second semiconductor layer.

* * * * *